United States Patent [19]

Miyanaga et al.

[11] Patent Number: 5,514,893
[45] Date of Patent: May 7, 1996

[54] SEMICONDUCTOR DEVICE FOR PROTECTING AN INTERNAL CIRCUIT FROM ELECTROSTATIC DAMAGE

[75] Inventors: Isao Miyanaga, Kawachinagano; Kazumi Kurimoto, Kobe; Atsushi Hori, Moriguchi; Shinji Odanaka, Hirakata, all of Japan

[73] Assignee: Matsushita Electric Industrial Co., Ltd., Osaka, Japan

[21] Appl. No.: 207,426

[22] Filed: Mar. 8, 1994

Related U.S. Application Data

[63] Continuation-in-part of Ser. No. 131,730, Oct. 5, 1993, abandoned.

[30] Foreign Application Priority Data

| Oct. 5, 1992 | [JP] | Japan | 4-265981 |
| Dec. 16, 1992 | [JP] | Japan | 4-335710 |
| Dec. 24, 1992 | [JP] | Japan | 4-343934 |
| Mar. 8, 1993 | [JP] | Japan | 5-046333 |

[51] Int. Cl.⁶ ............... H01L 23/62; H02H 9/00; H02H 3/20; H03K 17/60
[52] U.S. Cl. .......... 257/360; 257/355; 257/356; 257/362; 257/363; 361/90; 361/91; 361/56; 327/419; 327/427; 327/434; 327/437
[58] Field of Search ............... 257/355, 356, 257/357, 360, 361, 362, 358, 359, 363; 361/90, 91, 56; 307/248, 571, 584, 585

[56] References Cited

U.S. PATENT DOCUMENTS

| 4,994,874 | 2/1991 | Shimizu et al. | 257/362 |
| 5,021,853 | 6/1991 | Mistry | 257/361 |
| 5,075,577 | 12/1991 | Okitaka | 307/473 |
| 5,173,755 | 12/1992 | Co et al. | 257/361 |
| 5,181,092 | 1/1993 | Atsumi | 257/361 |
| 5,182,220 | 1/1993 | Ker et al. | 437/34 |

FOREIGN PATENT DOCUMENTS

| 2-82570 | 3/1990 | Japan | 257/360 |
| 3-38112 | 2/1991 | Japan | 257/361 |
| 4-145831 | 5/1992 | Japan | 257/361 |

OTHER PUBLICATIONS

Electrical Overstress/Electrostatic Discharge Symposium Proceedings, 1984, "A CMOS VLSI ESD Input protection Device, DIFIDW", by Lin et al., pp. 202–209.

Primary Examiner—Steven H. Loke
Attorney, Agent, or Firm—Ratner & Prestia

[57] ABSTRACT

A semiconductor device includes an input/output terminal, an internal circuit connected to the input/output terminal, a first terminal for providing a first electrical potential, and a second terminal for providing a second electrical potential which is lower than the first electrical potential, the device further including: a first n-channel MOS transistor having a drain connected to the input/output terminal, a source connected to the second terminal, and a gate to be electrically connected to the first terminal; and a first switching element for switching between an electrically conductive state and a non-conductive state between the drain and the gate of the first n-channel MOS transistor, the switching element forming the electrically conductive state between the drain and the gate of the first n-channel MOS transistor when 1) a surge voltage lower than the first electrical potential is applied to the input/output terminal, and 2) an electrical potential difference between the drain and the gate of the first n-channel MOS transistor exceeds a predetermined voltage lower than a breakdown voltage of the gate of the first n-channel MOS transistor. The formation of the electrically conductive state prevents the gate oxide of the first n-channel MOS transistor from being damaged.

35 Claims, 27 Drawing Sheets

( Prior art )

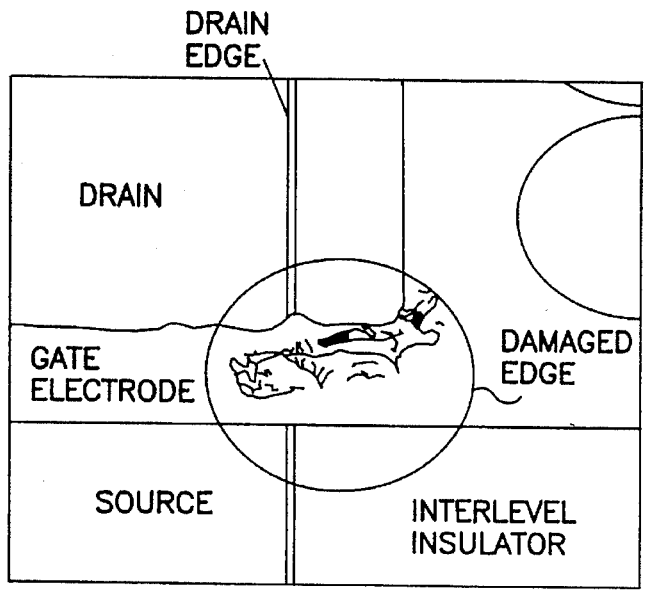
FIG. 21
(PRIOR ART)
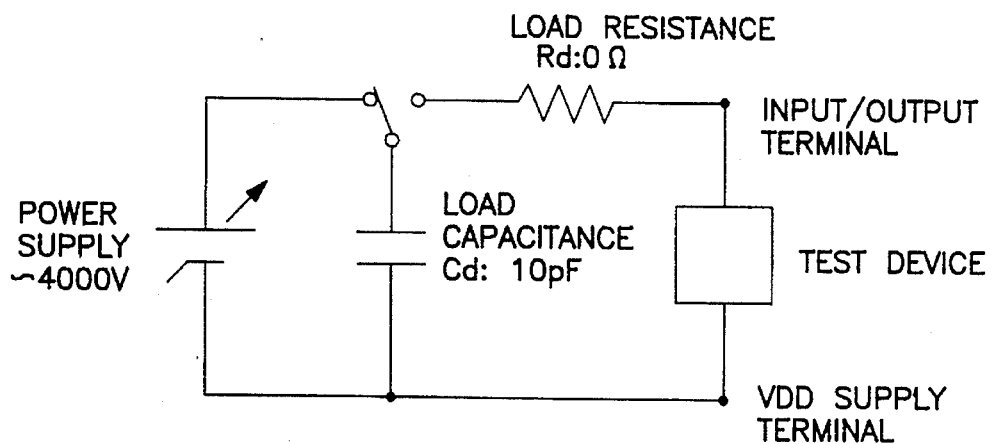
FIG. 22
| | BREAKDOWN |
|---|---|
| Nch TRANSISTOR 17 IS NOT USED | 1600V |
| Nch TRANSISTOR 17 IS USED | NO BREAKDOWN AT 4000V |
FIG. 23

5,514,893

1

SEMICONDUCTOR DEVICE FOR PROTECTING AN INTERNAL CIRCUIT FROM ELECTROSTATIC DAMAGE

This application is a continuation-in-part of U. S. patent application Ser. No. 08/131,730, filed Oct. 5, 1993, now abandoned.

BACKGROUND OF THE INVENTION

1. Field of the Invention

The present invention relates to a semiconductor device, and more particularly, a protection circuit for preventing an electrostatic damage in an integrated circuit.

2. Description of the Related Art

In recent years, the miniaturization of device elements in a semiconductor integrated circuit has been greatly advanced. The minimum size of device elements has reached a so-called submicron level, i.e., 1 μm or less. With the miniaturization of the device elements, in a MOS transistor, the gate oxide film has been made very thin. Because of this, the breakdown voltage of the gate oxide film is decreased, leading to a decrease in the resistance to electrostatic damage. In order to prevent the electrostatic damage, a protection circuit for preventing the electrostatic damage is provided in the vicinity of the pad.

Hereinafter, a conventional protection circuit for preventing an electrostatic damage will be described with reference to the drawings.

FIG. 17 shows an example of an input/output circuit equipped with a conventional protection circuit for preventing an electrostatic damage. In FIG. 17, an input/output terminal 1 is connected to each drain of a p-channel protection transistor 2, an n-channel protection transistor 3, a p-channel output transistor 4, and an n-channel output transistor 5. The input/output terminal 1 is further connected to an internal circuit 7 through an input protection resistor 6. A source and a gate of the p-channel protection transistor 2 are connected to a $V_{DD}$ supply terminal, and a source and a gate of the n-channel protection transistor 3 are connected to a ground terminal. A source and a gate of the p-channel output transistor 4 are connected to the $V_{DD}$ supply terminal and an internal circuit 8, respectively. A source and a gate of the n-channel output transistor 5 are connected to the ground terminal and an internal circuit 9, respectively. In the input/output circuit with such a structure, in a case where a surge voltage is applied between the input/output terminal and the ground terminal, the surge voltage is reduced through the n-channel protection transistor 3 which is in a conductive state. Likewise, in a case where a surge voltage is applied between the input/output terminal 1 and the $V_{DD}$ supply terminal, the surge voltage is reduced through the p-channel protection transistor 2 which is in a conductive state. In addition, the input protection resistor 6 protects the internal circuit 7 by attenuating a surge voltage.

Another example of an input/output circuit equipped with a conventional protection circuit for protecting electrostatic damage is shown in FIG. 19. In FIG. 19, an input/output terminal 49 is connected to each drain of a p-channel protection transistor 10, an n-channel protection transistor 11, a p-channel transfer gate transistor 12, and an n-channel transfer gate transistor 13. Each source of the p-channel transfer gate transistor 12 and the n-channel transfer gate transistor 13 is connected to a capacitor 14 of an internal circuit element (not shown). In addition, a source and a gate of the p-channel protection transistor 10 are connected to a

2

$V_{DD}$ supply terminal, a source and a gate of the n-channel protection transistor 11 are connected to a ground terminal. A gate of the p-channel transfer gate transistor 12 is connected to an internal circuit 15, and a gate of the n-channel transfer gate transistor 13 is connected to an internal circuit 16. In the input/output circuit with such a structure, in a case where a surge voltage is applied between the input/output terminal 49 and the ground terminal, the surge voltage is discharged through the n-channel protection transistor 11. Likewise, in a case where a surge voltage is applied between the input/output terminal 49 and the $V_{DD}$ supply terminal, the surge voltage is discharged through the p-channel protection transistor 10.

However, in the above-mentioned structure, there are the following problems:

As shown in FIG. 18, in a case where a surge voltage which is negative with respect to the $V_{DD}$ supply terminal is applied to the input/output terminal 1 under the condition that the ground terminal is open, the p-channel protection transistor 2 starts discharging. During this time, a high voltage is applied to the gate oxide film of the n-channel output transistor 5, since the gate of the n-channel output transistor 5 is connected to the $V_{DD}$ supply terminal through a $p^+$-drain and an n-well of a p-channel MOS transistor in the internal circuit 9. Since the voltage across a PN junction of the drain of the p-channel protection transistor 2 is clamped to be a certain voltage (discharge voltage), when the resistance of the drain (p-type diffusion) of the p-channel protection transistor 2 is relatively high, the voltage on the input/output terminal 1 cannot be readily decreased and the strong surge stress is applied to the gate oxide film of the n-channel output transistor 5. When the gate oxide film of the n-channel output transistor 5 is made thin along with the miniaturization of the device elements, the gate oxide film of the n-channel output transistor 5 is likely to break down due to the high voltage. FIG. 21 shows the state in which the gate oxide film and the gate electrode (polycrystalline silicon) of the n-channel output transistor 5 are broken down. In a case where a surge voltage which is positive with respect to the ground terminal is applied to the input/output terminal 1 under the condition that the $V_{DD}$ supply terminal is open, the gate oxide film of the p-channel output transistor 4 will be broken down.

As shown in FIG. 20, the same damage as that caused in the n-channel output transistor 5 in FIG. 18 is caused in the n-channel transfer gate transistor 13.

SUMMARY OF THE INVENTION

The semiconductor device of this invention, includes an input/output terminal, a first terminal for providing a first electrical potential, and a second terminal for providing a second electrical potential which is lower than the first electrical potential, wherein the device further includes:

a first n-channel MOS transistor having a drain connected to the input/output terminal, a source connected to the second terminal, and a gate to be electrically connected to the first terminal; and a first switching element for switching between an electrically conductive state and a non-conductive state between the drain and the gate of the first n-channel MOS transistor, the element forming the electrically conductive state between the drain and the gate of the first n-channel MOS transistor, in a case where a surge voltage lower than the first electrical potential is applied to the input/output terminal, and an electrical potential difference between the drain and the gate of the first n-channel MOS transistor exceeds a predetermined voltage lower than a breakdown voltage of the gate of the first n-channel MOS transistor, thereby preventing the gate of the first n-channel MOS transistor from being damaged.

In one embodiment of the present invention, the first switching element is a second n-channel MOS transistor having a source connected to the drain of the first n-channel MOS transistor, a drain connected to the gate of the first n-channel MOS transistor, and a gate connected to the second terminal.

In another embodiment of the present invention, the first switching element is an npn-bipolar transistor having an emitter connected to the drain of the first n-channel MOS transistor, a collector connected to the gate of the first n-channel MOS transistor, and a base connected to the second terminal.

In another embodiment of the present invention, the above-mentioned device further includes a p-channel MOS transistor having a drain connected to the input/output terminal and a source connected to the first terminal.

In another embodiment of the present invention, a circuit element is provided between the gate of the second n-channel MOS transistor and the second terminal.

In another embodiment of the present invention, the circuit element is a resistor.

In another embodiment of the present invention, the circuit element is a transistor.

According to another aspect of the present invention, a semiconductor device includes an input/output terminal, a first terminal for providing a first electrical potential, and a second terminal for providing a second electrical potential which is lower than the first electrical potential, wherein the device further includes:

a first p-channel MOS transistor having a drain connected to the input/output terminal, a source connected to the first terminal, and a gate to be electrically connected to the second terminal; and a second switching element for switching between an electrically conductive state and a non-conductive state between the drain and the gate of the first p-channel MOS transistor, the element forming the electrically conductive state between the drain and the gate of the first p-channel MOS transistor, in a case where a surge voltage higher than the second electrical potential is applied to the input/output terminal, and an electrical potential difference between the drain and the gate of the first p-channel MOS transistor exceeds a predetermined voltage lower than a breakdown voltage of the gate of the first p-channel MOS transistor, thereby preventing the gate of the first p-channel MOS transistor from being damaged.

In one embodiment of the present invention, the second switching element is a second p-channel MOS transistor having a source connected to the drain of the first p-channel MOS transistor, a drain connected to the gate of the first p-channel MOS transistor, and a gate connected to the first terminal.

In another embodiment of the present invention, the second switching element is a pnp-bipolar transistor having an emitter connected to the drain of the first p-channel MOS transistor, a collector connected to the gate of the first p-channel MOS transistor, and a base connected to the second terminal.

In another embodiment of the present invention, the above-mentioned device further includes a first n-channel MOS transistor having a drain connected to the input/output terminal and a source connected to the second terminal.

In another embodiment of the present invention, a circuit element is provided between the gate of the second p-channel MOS transistor and the first terminal.

In another embodiment of the present invention, the circuit element is a resistor.

In another embodiment of the present invention, the circuit element is a transistor.

According to another aspect of the present invention, a semiconductor device includes an input/output terminal, a first terminal for providing a first electrical potential, and a second terminal for providing a second electrical potential which is lower than the first electrical potential, wherein the device further includes:

a first n-channel MOS transistor having a drain connected to the input/output terminal, a source connected to the internal circuit, and a gate to be electrically connected to the first terminal; and a first switching element for switching between an electrically conductive state and a non-conductive state between the drain and the gate of the first n-channel MOS transistor, the element forming the electrically conductive state between the drain and the gate of the first n-channel MOS transistor, in a case where a surge voltage lower than the first electrical potential is applied to the input/output terminal, and an electrical potential difference between the drain and the gate of the first n-channel MOS transistor exceeds a predetermined voltage lower than a breakdown voltage of the gate of the first n-channel MOS transistor, thereby preventing the gate of the first n-channel MOS transistor from being damaged.

In one embodiment of the present invention, the first switching element is a second n-channel MOS transistor having a source connected to the drain of the first n-channel MOS transistor, a drain connected to the gate of the first n-channel MOS transistor, and a gate connected to the second terminal.

In another embodiment of the present invention, the first switching element is an npn-bipolar transistor having an emitter connected to the drain of the first n-channel MOS transistor, a collector connected to the gate of the first n-channel MOS transistor, and a base connected to the second terminal.

In another embodiment of the present invention, the above-mentioned device further includes a p-channel MOS transistor having a drain connected to the input/output terminal and a source connected to the internal circuit.

In another embodiment of the present invention, a circuit element is provided between the gate of the second n-channel MOS transistor and the second terminal.

In another embodiment of the present invention, the circuit element is a resistor.

In another embodiment of the present invention, the circuit element is a transistor.

According to another aspect of the present invention, a semiconductor device includes an input/output terminal, a first terminal for providing a first electrical potential, and a second terminal for providing a second electrical potential which is lower than the first electrical potential, wherein the device further includes:

a first p-channel MOS transistor having a drain connected to the input/output terminal, a source connected to the internal circuit, and a gate to be electrically connected to the first terminal; and a second switching element for switching between an electrically conductive state and a non-conductive state between the drain and the gate of the first p-channel MOS transistor, the element forming the electrically conductive state between the drain and the gate of the first p-channel MOS transistor, in a case where a surge voltage higher than the second electrical potential is applied to the input/output terminal, and an electrical potential difference between the drain and the gate of the first p-channel MOS transistor exceeds a predetermined voltage lower than a breakdown voltage of the gate of the first p-channel MOS transistor, thereby preventing the gate of the first p-channel MOS transistor from being damaged.

In one embodiment of the present invention, the second switching element is a second p-channel MOS transistor having a source connected to the drain of the first p-channel MOS transistor, a drain connected to the gate of the first p-channel MOS transistor, and a gate connected to the first terminal.

In another embodiment of the present invention, the second switching element is a pnp-bipolar transistor having an emitter connected to the drain of the first p-channel MOS transistor, a collector connected to the gate of the first p-channel MOS transistor, and a base connected to the first terminal.

In another embodiment of the present invention, the above-mentioned device further includes a first n-channel MOS transistor having a drain connected to the input/output terminal and a source connected to the internal circuit.

In another embodiment of the present invention, a circuit element is provided between the gate of the second n-channel MOS transistor and the second terminal.

In another embodiment of the present invention, the circuit element is a resistor.

In another embodiment of the present invention, the circuit element is a transistor.

According to another aspect of the present invention, a semiconductor device includes an input/output terminal, an internal circuit connected to the input/output terminal, a first terminal for providing a first electrical potential, and a second terminal for providing a second electrical potential which is lower than the first electrical potential, wherein the device further comprises:

a first protection means connected between the input/output terminal and the internal circuit, the first protection means guiding a surge charges applied to the input/output terminal to the first terminal or the second terminal, thereby lowering an electrical potential due to the surge charges; and an auxiliary protection means connected between the first protection means and the internal circuit, and further lowering the electrical potential due to the surge charges, the auxiliary protection means including an electronic element connected to at least one of the first terminal and the second terminal, a first protection resistor provided between the electronic element and the first protection means, and a second protection resistor provided between the electronic element and the internal circuit.

In one embodiment of the present invention, the electronic element includes an MOS transistor.

In another embodiment of the present invention, the electronic element includes a bipolar transistor.

In another embodiment of the present invention, the electronic element includes a p-channel MOS transistor having a drain connected to the first protection resistor, a source and a drain connected to the first supply terminal; and an n-channel MOS transistor having the drain connected to the first protection resistor, a source and a gate connected to the second supply terminal.

In another embodiment of the present invention, a resistance of the second protection resistor is larger than half of a total resistance of the first protection resistor and the second protection resistor.

In another embodiment of the present invention, a resistance of the second protection resistor is smaller than nine-tenth of a total resistance of the first protection resistor and the second protection resistor.

In another embodiment of the present invention, the auxiliary protection means further includes between the second protection resistor and the internal circuit, a second electronic element connected to at least one of the first terminal and the second terminal; and a third protection resistor provided between the second electronic element and the internal circuit.

In another embodiment of the present invention, a resistance of the first protection resistor is 10 ohms or more.

In another embodiment of the present invention, the first protection means includes an p-channel MOS transistor having a drain connected to the input/output terminal, and a source and a gate connected to the first supply terminal; and an n-channel MOS transistor having a drain connected to the input/output terminal, and a source and a gate connected to the second supply terminal.

According to the present invention, the n-channel MOS transistor or the npn-bipolar transistor is connected between the drain and the gate of the n-channel output transistor or the n-channel transfer gate transistor. Because of this structure, in a case where a surge voltage which is negative with respect to the $V_{DD}$ supply terminal is applied to the input/output terminal, the n-channel MOS transistor or the npn-bipolar transistor is conducted to absorb a voltage applied to the gate oxide film of the n-channel output transistor or the n-channel transfer gate transistor. Thus, the electrostatic damage to the gate oxide film due to the surge voltage can be prevented. Likewise, the p-channel MOS transistor or the pnp-bipolar transistor is connected between the drain and the gate of the p-channel output transistor or the p-channel transfer gate transistor. Because of this structure, in a case where a surge voltage which is positive with respect to the ground terminal is applied to the input/output terminal, the p-channel MOS transistor or the pnp-bipolar transistor is conducted to absorb a voltage applied to the gate oxide film of the p-channel output transistor or the p-channel transfer gate transistor. Thus, the electrostatic damage to the oxide film due to the surge voltage can be prevented.

Thus, the invention described herein makes possible the advantage of providing a semiconductor device having breakdown voltage with respect to a high electrostatic damage by preventing the gate oxide films of an output transistor and a transfer gate transistor from being damaged.

This and other advantages of the present invention will become apparent to those skilled in the art upon reading and understanding the following detailed description with reference to the accompanying figures.

BRIEF DESCRIPTION OF THE DRAWINGS

FIG. 21 is a view showing an electrostatic damage in a conventional semiconductor device.

FIG. 22 is a diagram of a circuit for testing an electrostatic damage.

FIG. 23 are test results showing the effects of the first example according to the present invention.

DESCRIPTION OF THE PREFERRED EMBODIMENTS

The present invention will be described by way of illustrative examples with reference to the drawings.

EXAMPLE 1

Figure 1:
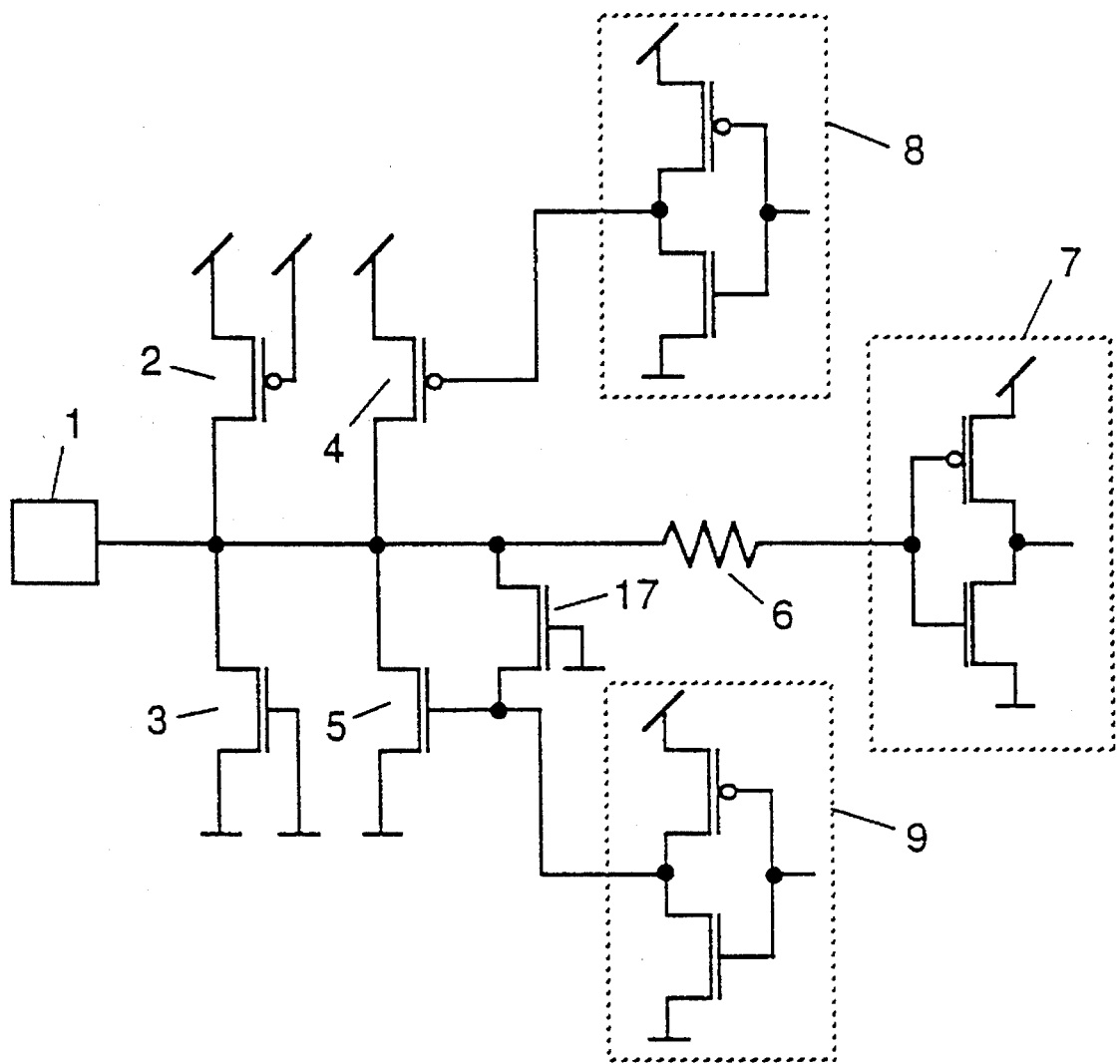
FIG. 1 is a circuit diagram of a semiconductor device of the first example according to the present invention.

FIG. 1 shows a circuit diagram of a semiconductor device of the first example according to the present invention. In FIG. 1, an input/output terminal 1 is connected to each drain of a p-channel protection transistor 2, an n-channel protection transistor 3, a p-channel output transistor 4, and an n-channel output transistor 5. The input/output terminal 1 is further connected to an internal circuit 7 through an input protection resistor 6. A source and a gate of the p-channel protection transistor 2 are connected to a $V_{DD}$ supply terminal, and a source and a gate of the n-channel protection transistor 3 are connected to a ground terminal. A source and a gate of the p-channel output transistor 4 are connected to the $V_{DD}$ supply terminal and an internal circuit 8, respectively. A source and a gate of the n-channel output transistor 5 are connected to the ground terminal and an internal circuit 9, respectively. According to the present example, an n-channel MOS transistor 17 as a first switching element is further provided. A source and a drain of the n-channel MOS transistor 17 are connected to a drain and a gate of the n-channel output transistor 5, respectively. A gate of the n-channel MOS transistor 17 is connected to the ground terminal. According to the present example, in a case where a surge voltage which is negative with respect to the $V_{DD}$ supply terminal is applied to the input/output terminal 1 under the condition that the ground terminal is open, even though the gate of the n-channel output transistor 5 is connected to the $V_{DD}$ supply terminal through a p+drain and an n-well in the internal circuit 9, the n-channel MOS transistor 17 works to reduce a voltage applied to the gate oxide film of the n-channel output transistor 5. The n-channel MOS transistor 17 switches between an electrical conductive state and a non-conductive state between the drain and the gate of the n-channel output transistor 5. More specifically, in a case where a surge voltage which is lower than the electrical potential of the $V_{DD}$ supply terminal is applied to the input/output terminal 1, when an electrical potential difference between the drain and the gate of the n-channel output transistor 5 exceeds a certain value (e.g., 14 V), the n-channel MOS transistor 17 switches a non-conductive state to a conductive state between the drain and the gate of the n-channel output transistor 5. The n-channel MOS transistor 17 is designed so that "a certain value" mentioned above becomes sufficiently lower than the gate breakdown voltage (e.g., 16 V) of the n-channel output transistor 5. Because of this switching, a path is formed between the drain and the gate of the n-channel output transistor 5 through the n-channel MOS transistor 17, whereby the electrical potential difference between the drain and the gate of the n-channel output transistor 5 is suppressed to be under the gate breakdown voltage. When an electrostatic damage test is conducted by using a conventional circuit shown in FIG. 22, the results as shown in FIG. 23 can be obtained. That is, in the case of an input/output circuit having no n-channel MOS transistor 17, the gate breakdown voltage is 1600 V; however, in the case of an input/output circuit having the n-channel MOS transistor 17, the gate breakdown voltage is not caused up to 4000 V. As is apparent from these results, the electrostatic damage to the oxide film of the output transistor due to the surge voltage can be prevented by providing the n-channel MOS transistor 17.

In the present example, the drain of the n-channel output transistor 5 and the source of the n-channel MOS transistor 17 can be formed in the same n-type diffusion region. In addition, the present example is the input/output circuit; however, the present example can be an output circuit which requires that a gate damage to the output transistor can be prevented. Moreover, in the present example, the gate of the n-channel MOS transistor 17 is directly connected to the ground terminal; however, the gate of the n-channel MOS transistor 17 can be connected to the ground terminal through a resistor or a transistor which is always ON.

EXAMPLE 2

Figure 2:
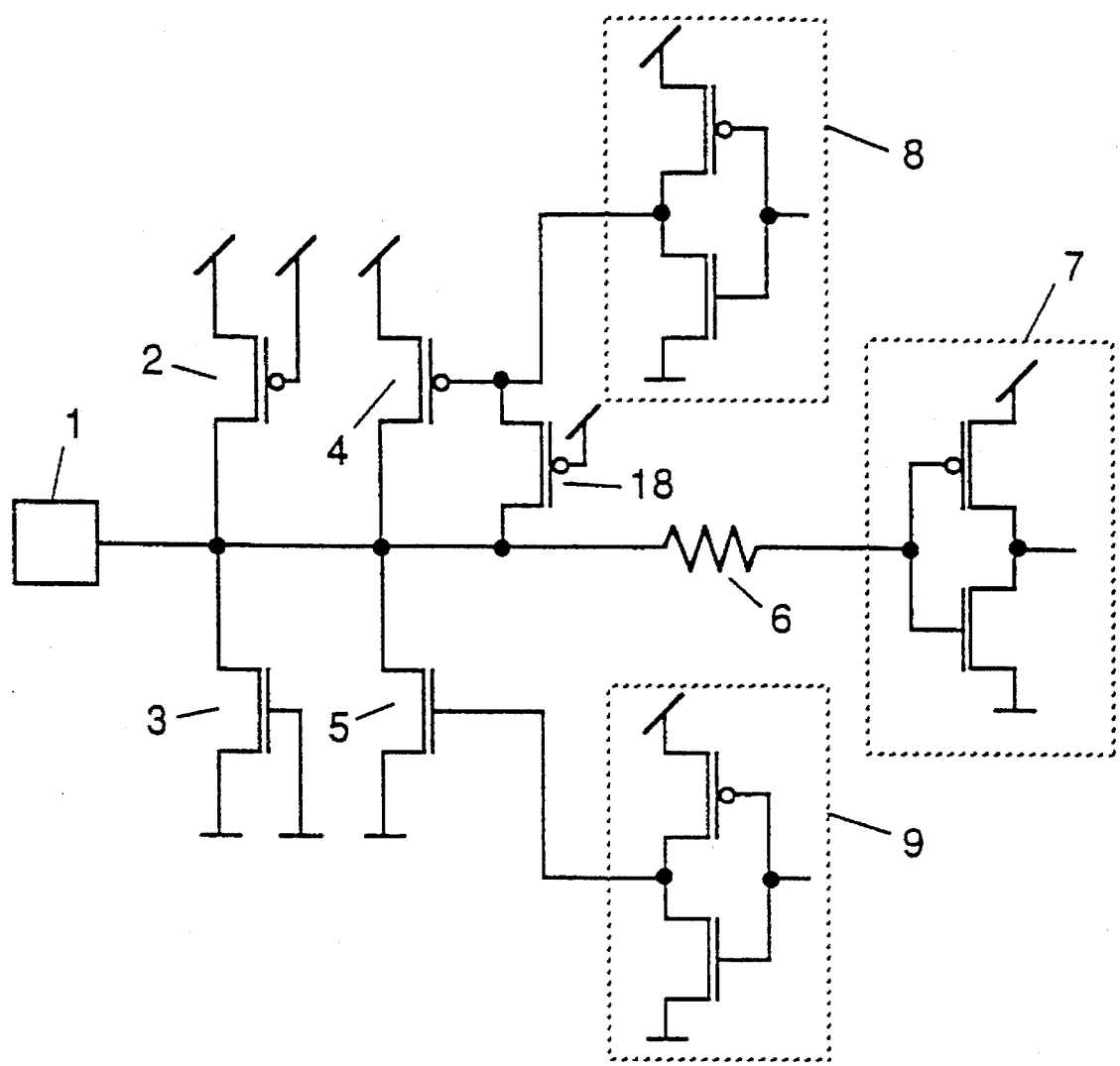
FIG. 2 circuit diagram of a semiconductor device of the second example according to the present invention.

FIG. 2 shows a circuit diagram of a semiconductor device of the second example according to the present invention. The structure of the present example is the same as that of Example 1, except that a p-channel MOS transistor 18 as a second switching element is provided instead of the n-channel MOS transistor 17. A source and a drain of the p-channel MOS transistor 18 are connected to a drain and a gate of the p-channel output transistor 4, and a gate of the n-channel MOS transistor 18 is connected to a $V_{DD}$ supply terminal, respectively. According to the present example, in a case where a surge voltage which is positive with respect to the ground terminal is applied to the input/output terminal 1 under the condition that the $V_{DD}$ supply terminal is open, even though the gate of the p-channel output transistor 4 is connected to the ground terminal through an $n^+$-drain and a p-type substrate in the n-channel MOS transistor in the internal circuit 8, the p-channel MOS transistor 18 works to reduce a voltage applied to the gate oxide film of the p-channel output transistor 4 in the same way as the n-channel MOS transistor 17 of Example 1. Thus, the electrostatic damage to the gate oxide film of the p-channel output transistor 4 due to the surge voltage can be prevented.

In the present example, the drain of the p-channel output transistor 4 and the source of the p-channel MOS transistor 18 can be formed in the same p-type diffusion region. In addition, the present example is the input/output circuit; however, the present example can be an output circuit which requires that a gate damage to the output transistor can be prevented. Moreover, in the second example, the gate of the p-channel MOS transistor 18 is directly connected to the $V_{DD}$ supply terminal; however, the gate of the p-channel MOS transistor 18 can be connected to the $V_{DD}$ supply terminal through a resistor or a transistor which is always ON.

EXAMPLE 3

Figure 3:
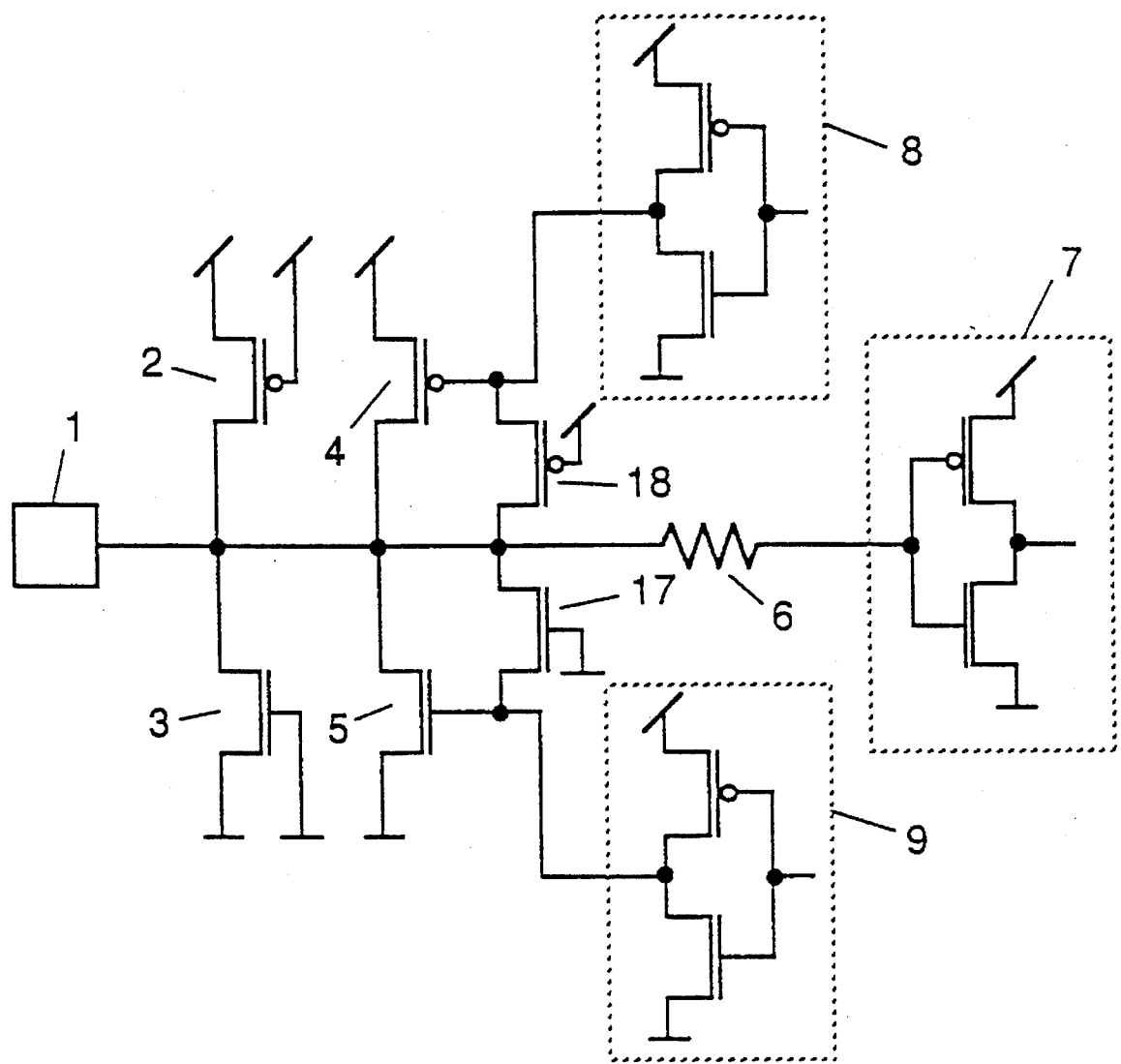
FIG. 3 is a circuit diagram of a semiconductor device of the third example according to the present invention.

FIG. 3 shows a circuit diagram of a semiconductor device of the third example according to the present invention. The structure of the present example is the same as that of Example 1, except that the n-channel MOS transistor 17 as the first switching element and the p-channel MOS transistor 18 as the second switching element are formed in the same input/output circuit.

EXAMPLE 4

Figure 4:
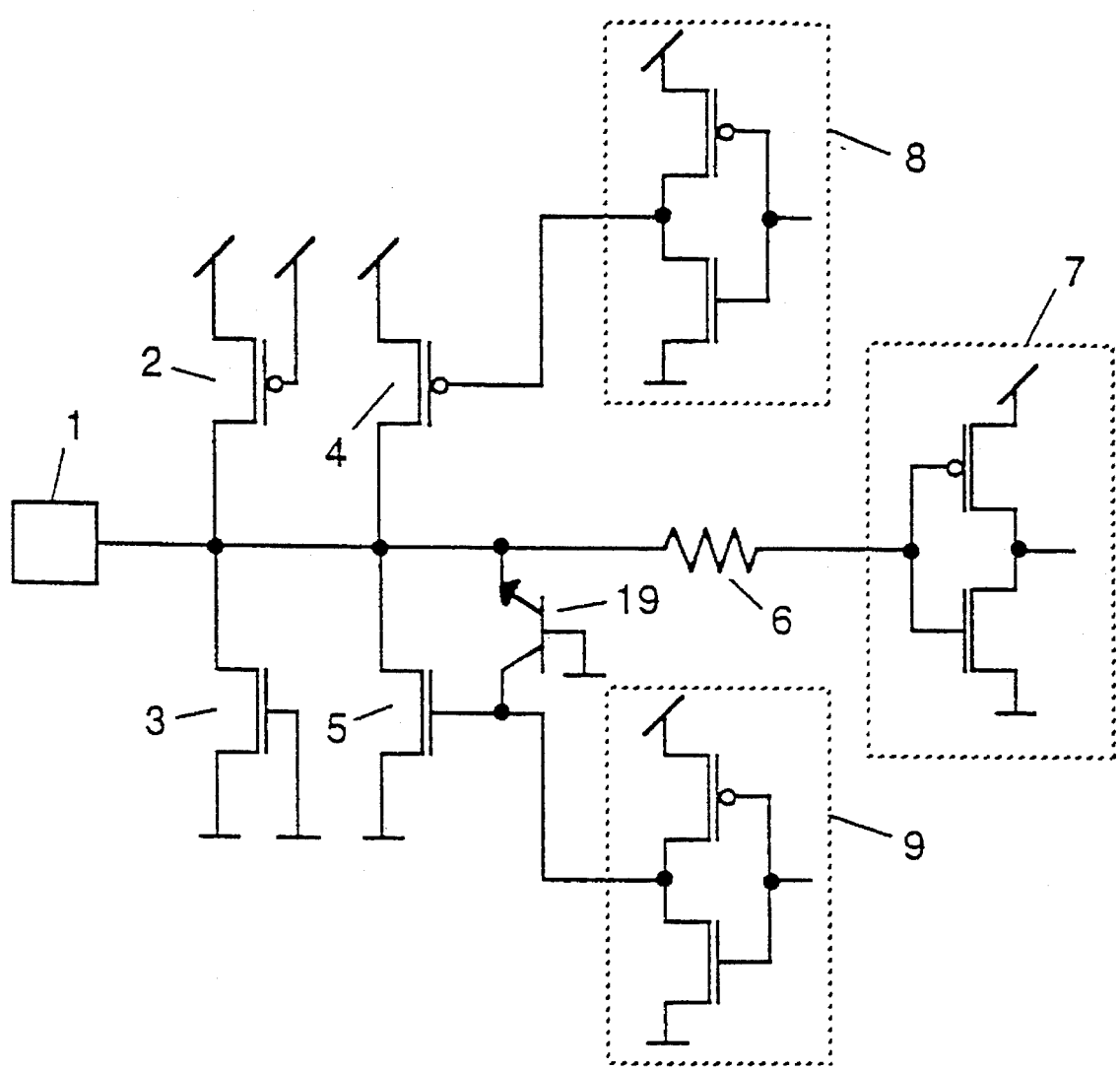
FIG. 4 is a circuit diagram of a semiconductor device of the fourth example according to the present invention.

FIG. 4 is a circuit diagram of a semiconductor device of the fourth example according to the present invention. The structure of the present example is the same as that of Example 1, except that an npn bipolar transistor 19 is provided as a first switching element instead of the n-channel MOS transistor 17.

Figure 5:
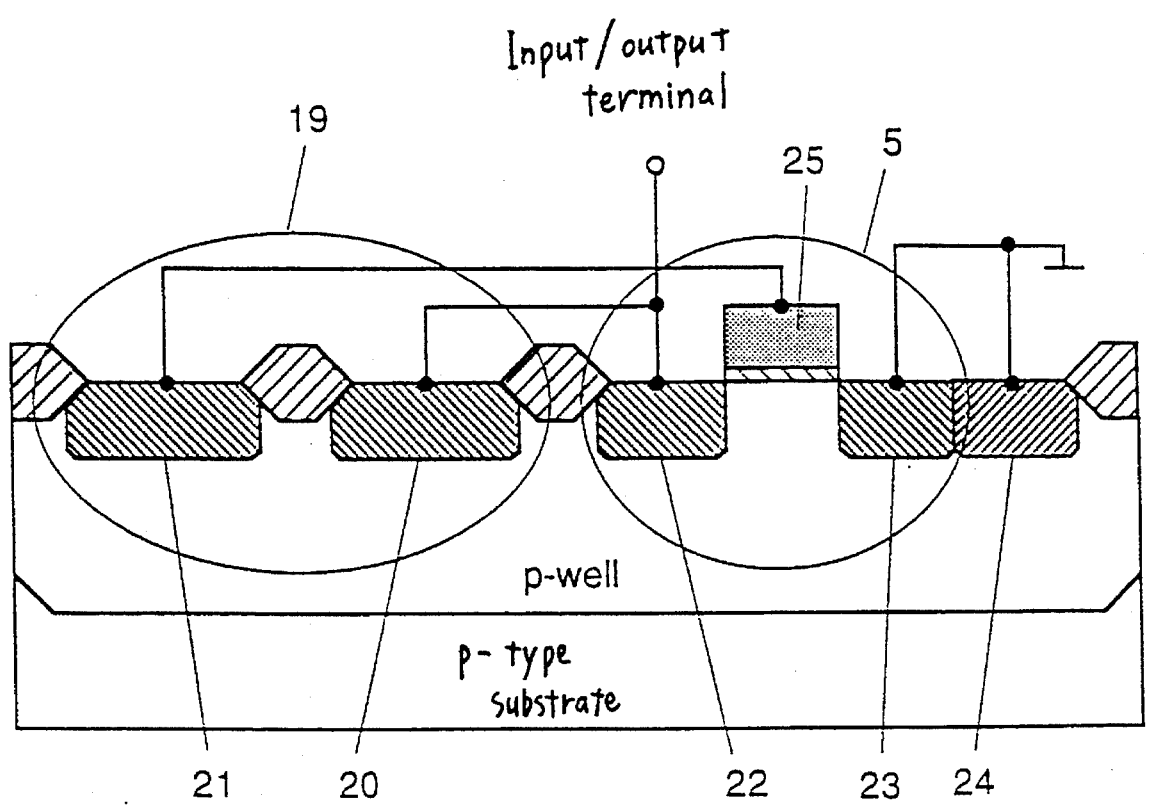
FIG. 5 is a cross-sectional view showing a semiconductor devices of the fourth example according to the present invention.

FIG. 5 is a cross-sectional view showing an example of the npn-bipolar transistor 19. The npn-bipolar transistor is formed of a p-well and n-type diffusion regions 20 and 21 with high impurity concentration disposed in the p-well. The n-type diffusion regions 20 and 21 are connected to a drain 22 and a gate electrode 25 of the n-channel output transistor 5, respectively. The p-well works as a base of the npn-bipolar transistor 19 and is grounded through a p-type diffusion region 24 which is adjacent to source region 23 of transistor 5, with high impurity concentration. According to the present example, in a case where a surge voltage which is negative with respect to the $V_{DD}$ supply terminal is applied to the input/output terminal 1 under the condition that the ground terminal is open, the npn-bipolar transistor 19 works to reduce a voltage applied to the gate oxide film of the n-channel output transistor 5. Thus, the electrostatic damage to the gate oxide film of the n-channel output transistor 5 due to the surge voltage can be prevented.

In the present example, the drain 22 of the n-channel output transistor 5 and the n-type diffusion region 20 of the npn-bipolar transistor 19 can be formed in the same n-type diffusion region. In addition, the present example is the input/output circuit; however, the present example can be an output circuit which requires that a gate damage to the output transistor can be prevented.

EXAMPLE 5

Figure 6:
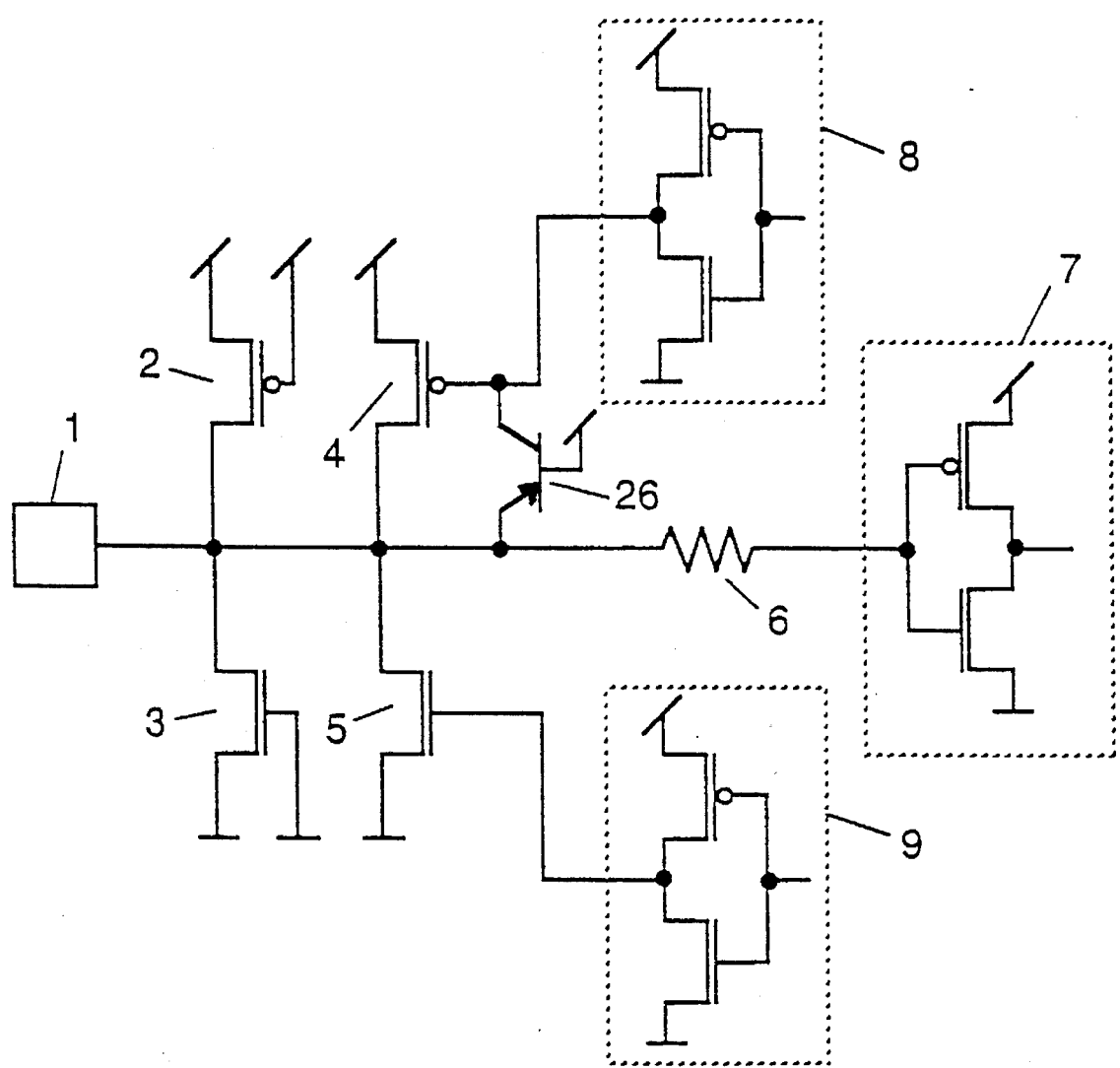
FIG. 6 is a circuit diagram of a semiconductor device of the fifth example according to the present invention.

FIG. 6 is a circuit diagram of a semiconductor device of the fifth example according to the present invention. The structure of the present example is the same as that of Example 1, except that a pnp-bipolar transistor 26 is provided as a second switching element instead of the n-channel MOS transistor 17.

Figure 7:
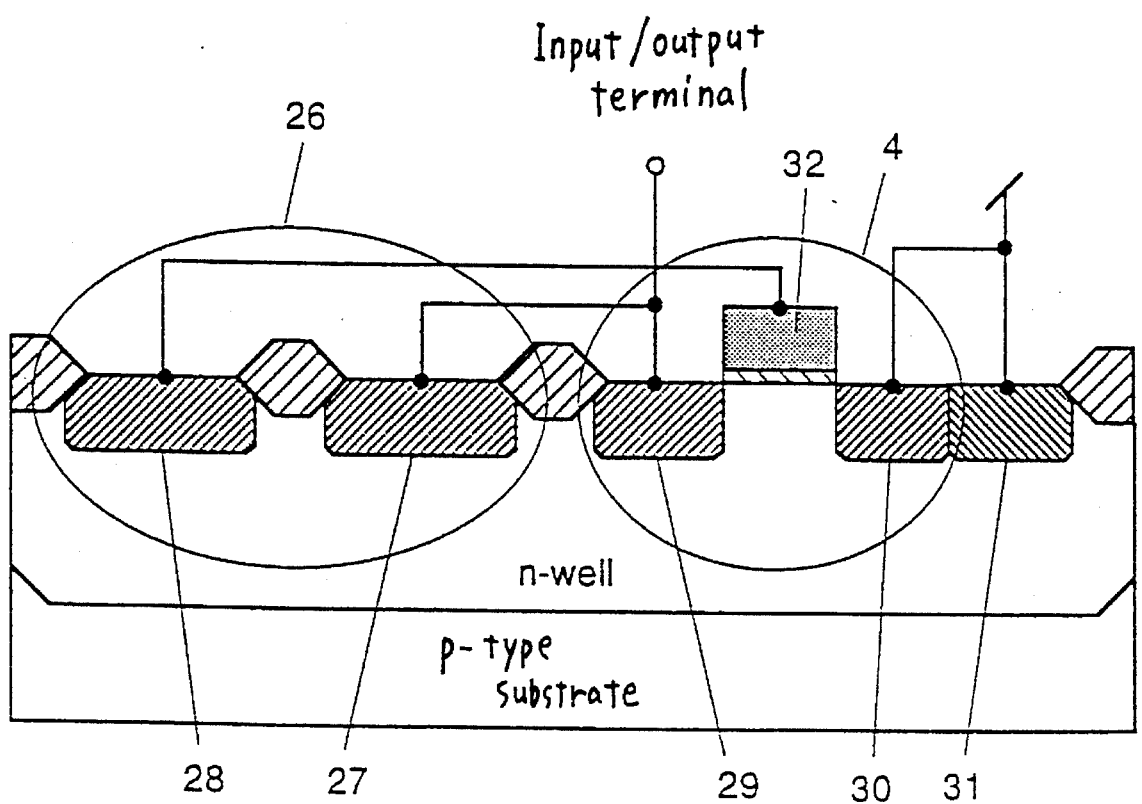
FIG. 7 is a cross-sectional view showing a semiconductor device of the fifth example according to the present invention.

FIG. 7 is a cross-sectional view showing the pnp-bipolar transistor 26. The pnp-bipolar transistor 26 is formed of an n-well and p-type diffusion regions 27 and 28 with high concentration disposed above the n-well. The p-type diffusion regions 27 and 28 are connected to a drain 29 and a gate electrode 32 of the p-channel output transistor 4, respectively. The n-well is a base of the pnp-bipolar transistor 26 and is connected to the $V_{DD}$ supply terminal through an n-type diffusion region 31, which is adjacent to source region 30 of transistor 4, with high concentration. According to the present example, in a case where a surge voltage which is positive with respect to the ground terminal is applied to the input/output terminal 1 under the condition that the $V_{DD}$ supply terminal is open, the pnp-bipolar transistor 26 works to reduce a voltage applied to the gate oxide film of the p-channel output transistor 4. Thus, the electrostatic damage to the gate oxide film of the p-channel output transistor 4 due to the surge voltage can be prevented.

In the present example, the drain 29 of the p-channel output transistor 4 and the p-type diffusion region 27 of the pnp-bipolar transistor 26 can be formed in the same p-type diffusion region. In addition, the present example is the input/output circuit; however, the present example can be an output circuit which requires that a gate damage to the output transistor can be prevented.

EXAMPLE 6

Figure 8:
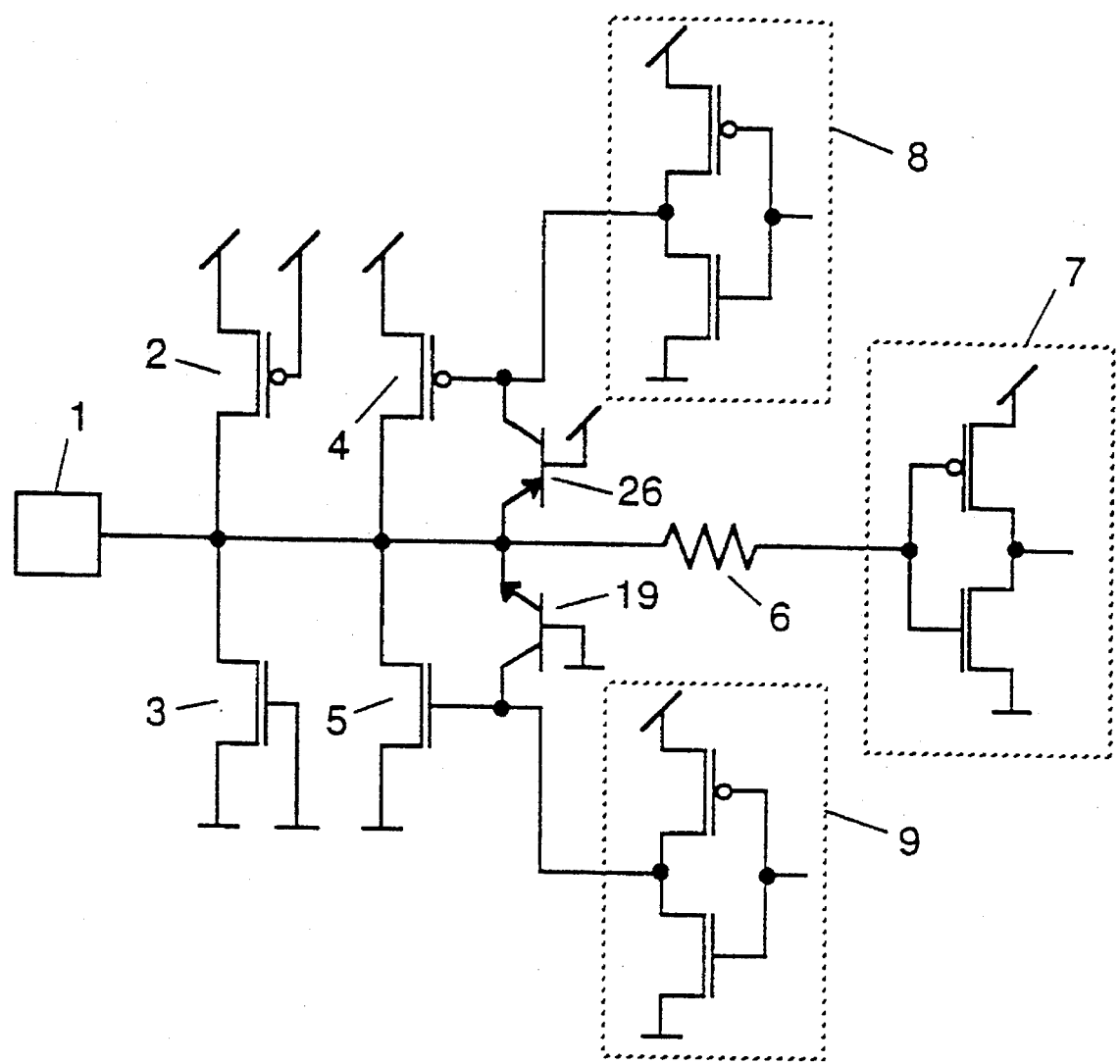
FIG. 8 is a circuit diagram of a semiconductor device of the sixth example according to the present invention.

FIG. 8 is a circuit diagram of a semiconductor device of the sixth example according to the present invention. The structure of the present example is the same as that of Example 1, except that the npn-bipolar transistor 19 as the first switching element and the pnp-bipolar transistor 26 as the second switching element are formed in the same input/output circuit.

EXAMPLE 7

Figure 9:
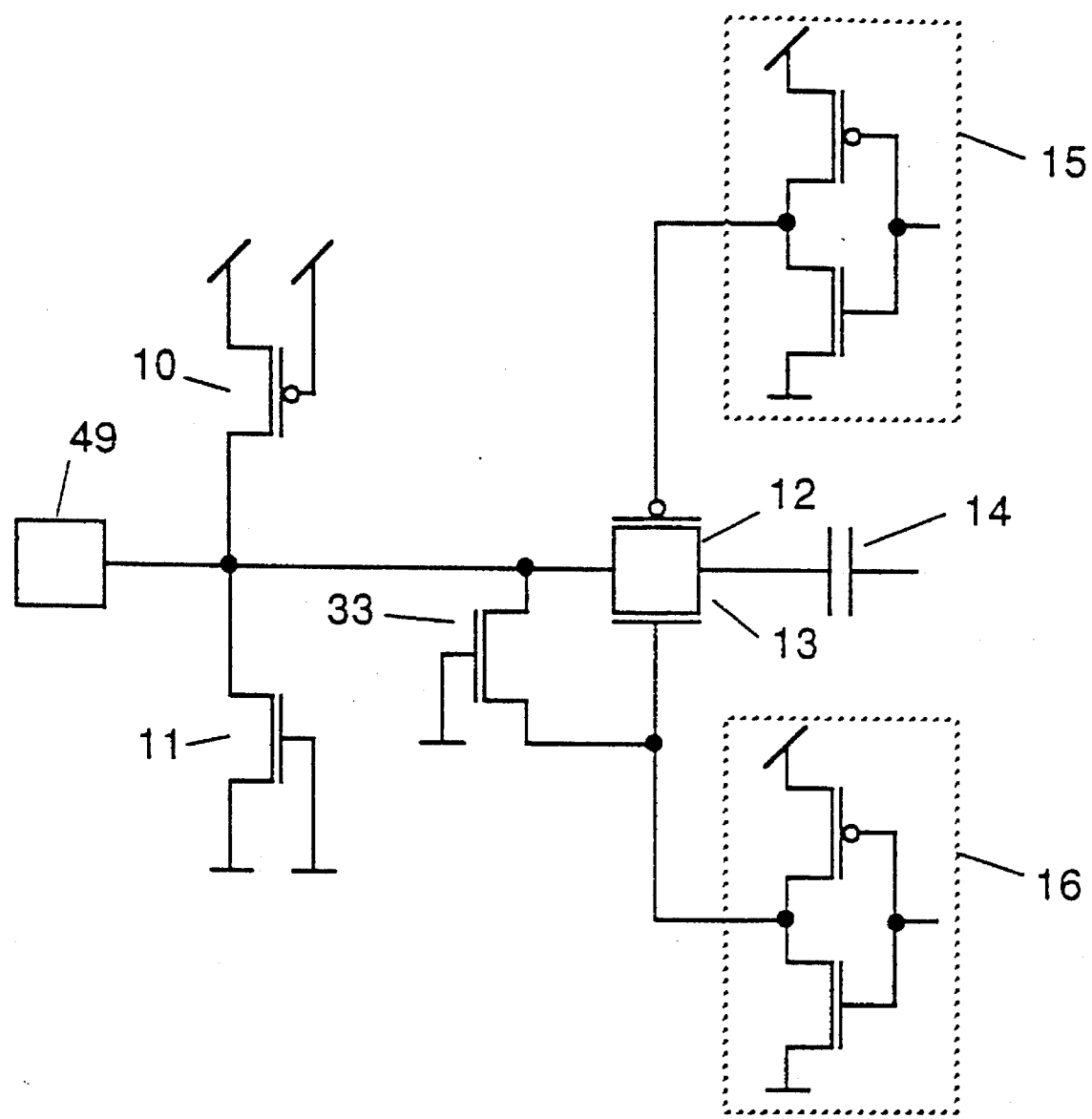
FIG. 9 is a circuit diagram of a semiconductor device of the seventh example according to the present invention.

FIG. 9 is a circuit diagram of a semiconductor device of the seventh example according to the present invention. In FIG. 9, an input/output terminal 49 is connected to each drain of a p-channel protection transistor 10, an n-channel protection transistor 11, a p-channel transfer gate transistor. 12, and an n-channel transfer gate transistor 13. Each source of the p-channel transfer gate transistor 12 and the n-channel transfer gate transistor 13 is connected to a capacitor 14 of an internal circuit element (not shown). In addition, a source and a gate of the p-channel protection transistor 10 are connected to a $V_{DD}$ supply terminal, a source and a gate of the n-channel protection transistor 11 are connected to a ground terminal. A gate of the p-channel transfer gate transistor 12 is connected to an internal circuit 15, and a gate of the n-channel transfer gate transistor 13 is connected to an internal circuit 16. In the present example, an n-channel MOS transistor 33 as a first switching element is provided. A source and a drain of the n-channel MOS transistor 33 are connected to a drain and a gate of the n-channel transfer gate transistor 13, and a gate of the n-channel MOS transistor 33 is connected to the ground terminal. According to the present example, in a case where a surge voltage which is negative with respect to the $V_{DD}$ supply terminal is applied to the input/output terminal 49, the n-channel MOS transistor 33 works to reduce a voltage applied to the gate oxide film of the n-channel transfer gate transistor 13. Thus, the electrostatic damage to the gate oxide film of the n-channel transfer gate transistor 13 due to the surge voltage can be prevented.

In the present example, the gate of the n-channel MOS transistor 33 is directly connected to the ground terminal; however, the gate of the n-channel MOS transistor 33 can be connected to the ground terminal through a resistor or a transistor which is always ON. In addition, the drain of the n-channel transfer gate transistor 13 and the source of the n-channel MOS transistor 33 can be formed in the same n-type diffusion region.

EXAMPLE 8

Figure 10:
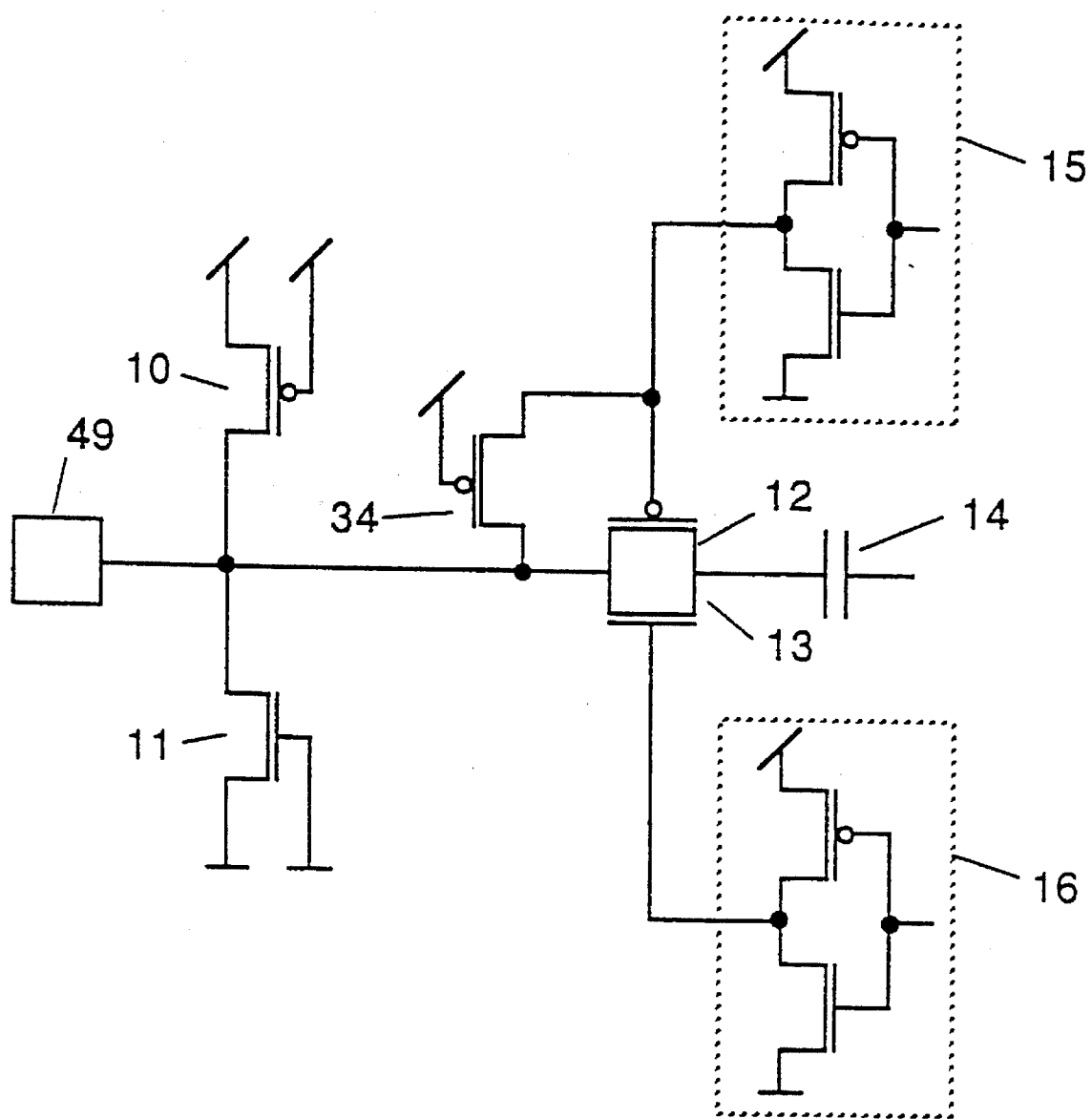
FIG. 10 is a circuit diagram of a semiconductor device of the eighth example according to the present invention.

FIG. 10 is a circuit diagram of a semiconductor device of the eighth example according to the present invention. The structure of the present example is the same as that of Example 7, except that a p-channel MOS transistor 34 is provided instead of the n-channel MOS transistor 33. A source and a drain of the p-channel MOS transistor 34 as a second switching element is connected to a drain and a gate of the p-channel transfer gate transistor 12, and a gate of the p-channel MOS transistor 34 is connected to the $V_{DD}$ supply terminal. According to the present example, in a case where a surge voltage which is positive with respect to the ground terminal is applied to the input/output terminal 49 under the condition that the $V_{DD}$ supply terminal is open, the p-channel MOS transistor 34 works to reduce a voltage applied to the gate oxide film of the p-channel transfer gate transistor 12. Thus, the electrostatic damage to the gate oxide film of the p-channel transfer gate transistor 12 due to the surge voltage can be prevented.

In the present example, the gate of the p-channel MOS transistor 34 is directly connected to the $V_{DD}$ supply terminal; however, the gate of the p-channel MOS transistor 34 can be connected to the $V_{DD}$ supply terminal through the resistor or the transistor which is always ON. In addition, the drain of the p-channel transfer gate transistor 12 and the source of the p-channel MOS transistor 34 can be formed in the same p-type diffusion region.

EXAMPLE 9

Figure 11:
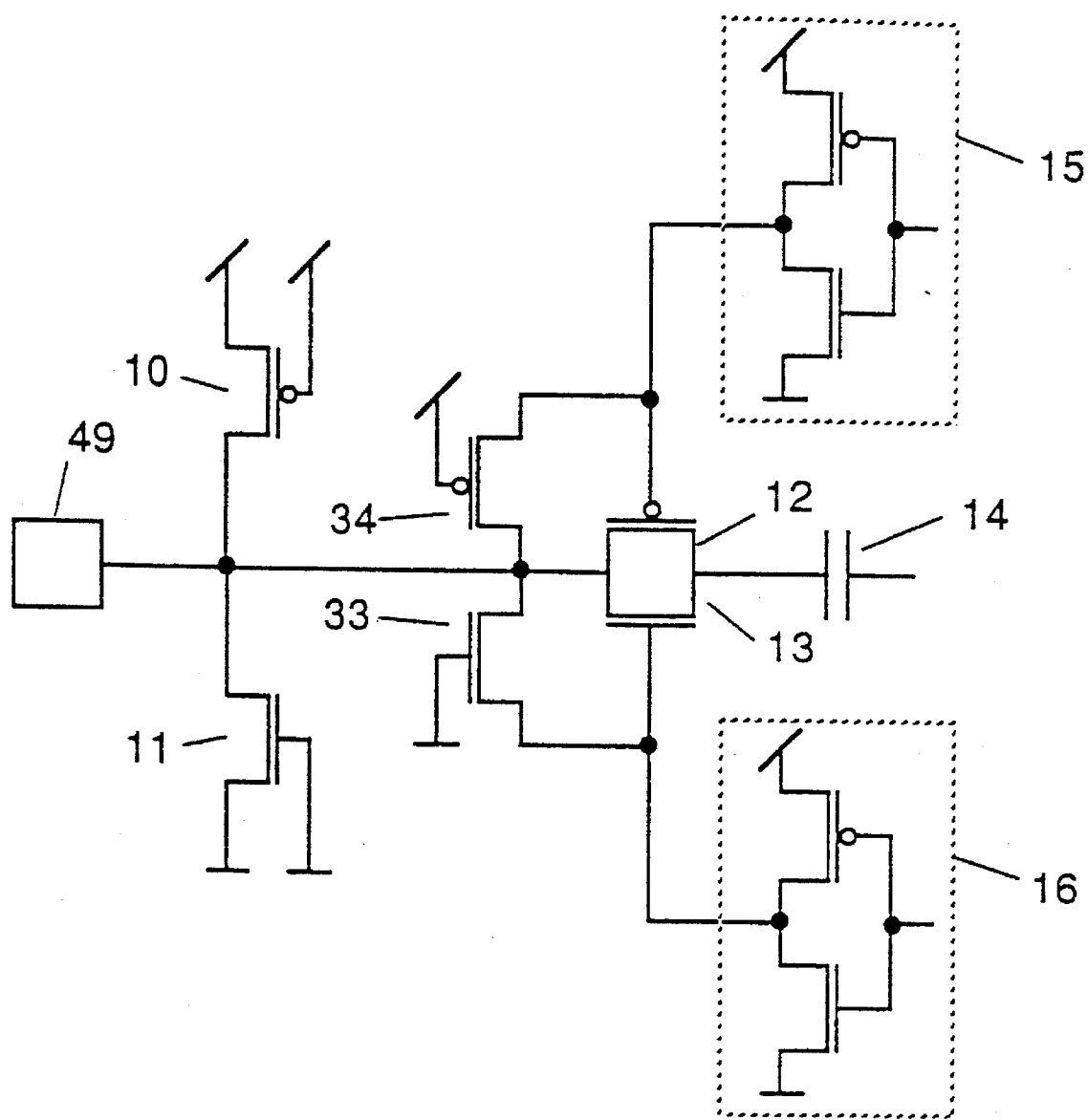
FIG. 11 is a circuit diagram of a semiconductor device of the ninth example according to the present invention.

FIG. 11 is a circuit diagram of a semiconductor device of the ninth example according to the present invention. In the present example, the n-channel MOS transistor 33 as the first switching element and the p-channel MOS transistor 34 as the second switching element are formed in the same input/output circuit.

EXAMPLE 10

Figure 12:
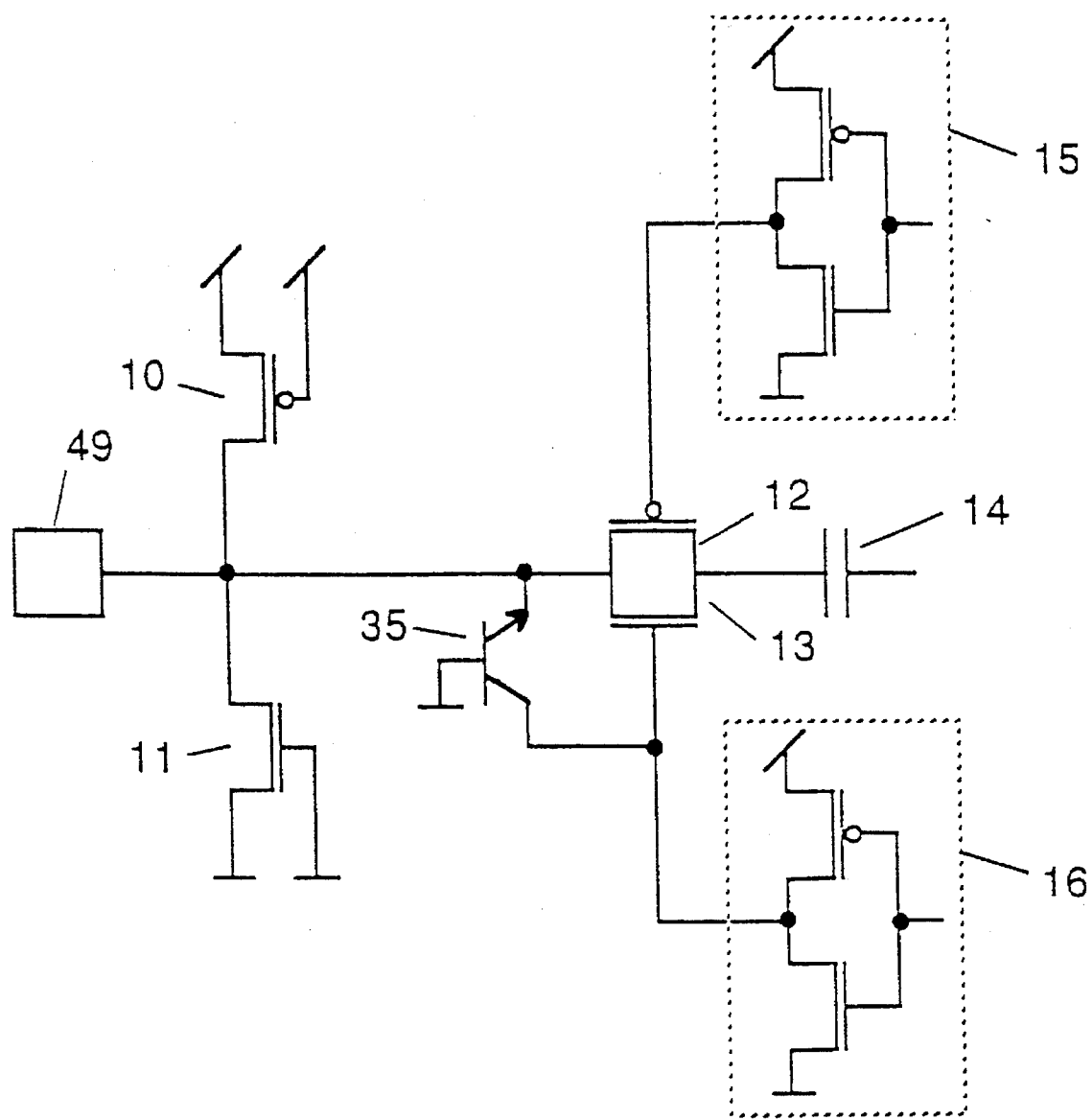
FIG. 12 is a circuit diagram of a semiconductor device of the tenth example according to the present invention.
Figure 13:
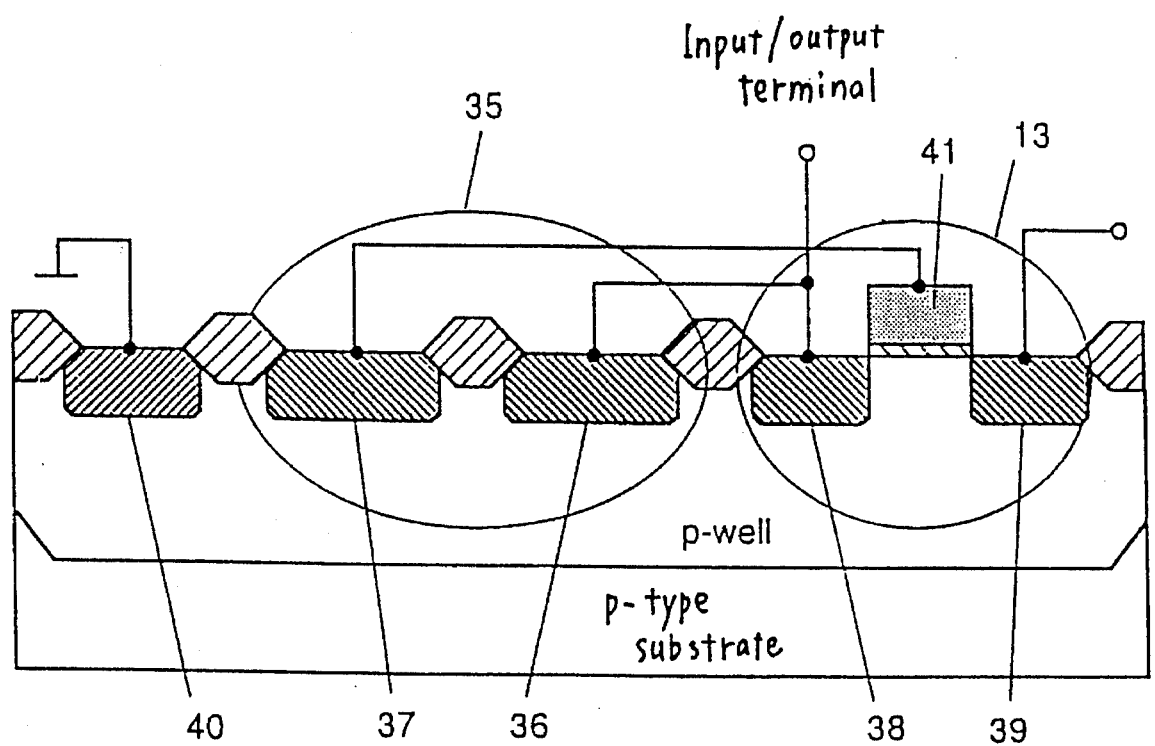
FIG. 13 is a cross-sectional view showing a semiconductor device of the tenth example according to the present invention.

FIG. 12 is a circuit diagram of a semiconductor device of the tenth example according to the present invention. The structure of the present example is the same as that of Example 7, except that an npn-bipolar transistor 35 is provided as the first switching element instead of the n-channel MOS transistor 33. FIG. 13 shows a cross-sectional view showing the npn-bipolar transistor 35. The npn-bipolar transistor 35 is formed of a p-well and n-type diffusion regions 36 and 37 with high concentration disposed above the p-well. The n-type diffusion regions 36 and 37 are connected to a drain 38 and a gate electrode 41 of the n-channel transfer gate transistor 13, respectively. The p-well works as a base of the npn-bipolar transistor 35 and is grounded through a p-type diffusion region 40. According to the present example, in a case where a surge voltage which is negative with respect to the $V_{DD}$ supply terminal is applied to the input/output terminal 49 under the condition that the ground terminal is open, the npn-bipolar transistor 35 works to reduce a voltage applied to the gate oxide film of the n-channel transfer gate transistor 13. Thus, the electrostatic damage to the gate oxide film of the n-channel transfer gate transistor 13 due to the surge voltage can be prevented. Source region 39 of transistor 13 serves as an electrode.

In the present example, the drain 38 of the n-channel transfer gate transistor 13 and the n-type diffusion region 36 of the npn-bipolar transistor 35 can be formed in the same n-type diffusion region.

EXAMPLE 11

Figure 14:
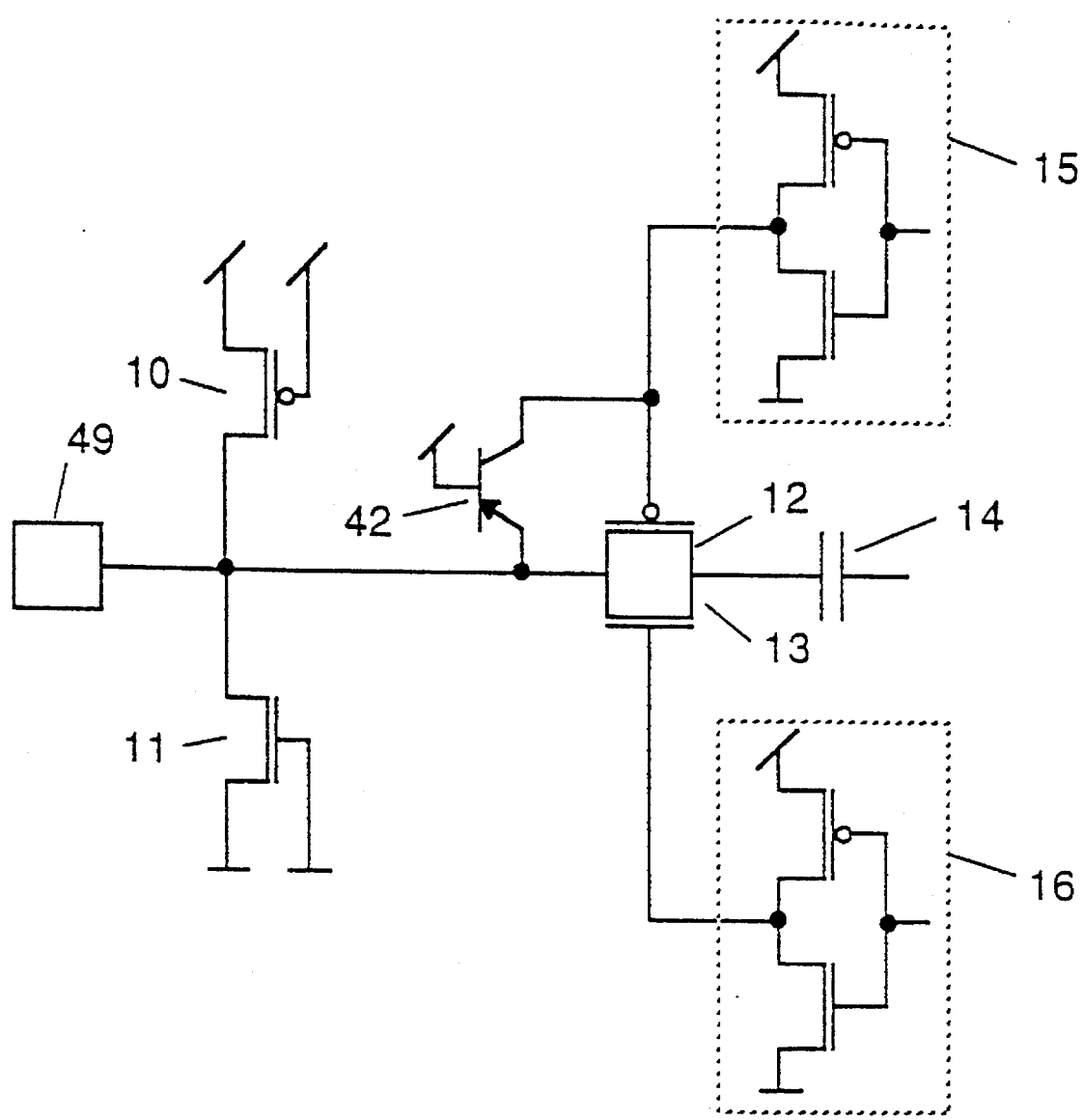
FIG. 14 is a circuit diagram of a semiconductor device of the eleventh example according to the present invention.
Figure 15:
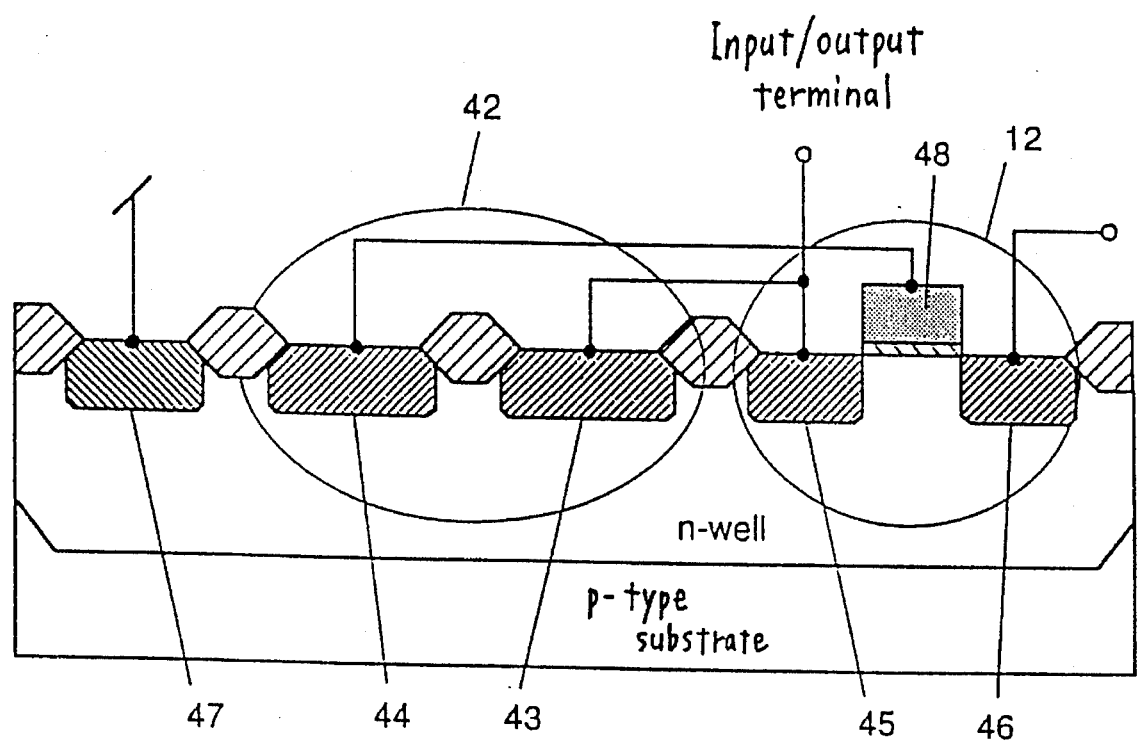
FIG. 15 is a cross-sectional view showing a semiconductor device of the eleventh example according to the present invention.

FIG. 14 is a circuit diagram of a semiconductor device of the eleventh example according to the present invention. The structure of the present example is the same as that of Example 7, except that a pnp-bipolar transistor 42 is provided as a second switching element instead of the n-channel MOS transistor 33. FIG. 15 is a cross-sectional view showing the pnp-bipolar transistor 42. The pnp-bipolar transistor 42 is formed of an n-well and p-type diffusion regions 43 and 44 with high concentration disposed above the n-well. The p-type diffusion regions 43 and 44 are connected to a drain 45 and a gate electrode 48 of the p-channel transfer gate transistor 12, respectively. The n-well is a base of the pnp-bipolar transistor 42 and is connected to the $V_{DD}$ supply terminal through an n-type diffusion region 47 with high concentration. According to the present example, in a case where a surge voltage which is positive with respect to the ground terminal is applied to the input/output terminal 49, the pnp-bipolar transistor 42 works to reduce a voltage applied to the gate oxide film of the p-channel transfer gate transistor 12. Thus, the electrostatic damage to the gate oxide film of the p-channel transfer gate transistor 12 due to the surge voltage can be prevented. Source region 46 of transistor 12 serves as an electrode.

In the eleventh example, the drain 45 of the p-channel transfer gate transistor 12 and the p-type diffusion region 43 of the pnp-bipolar transistor 42 can be formed in the same p-type diffusion region.

EXAMPLE 12

Figure 16:
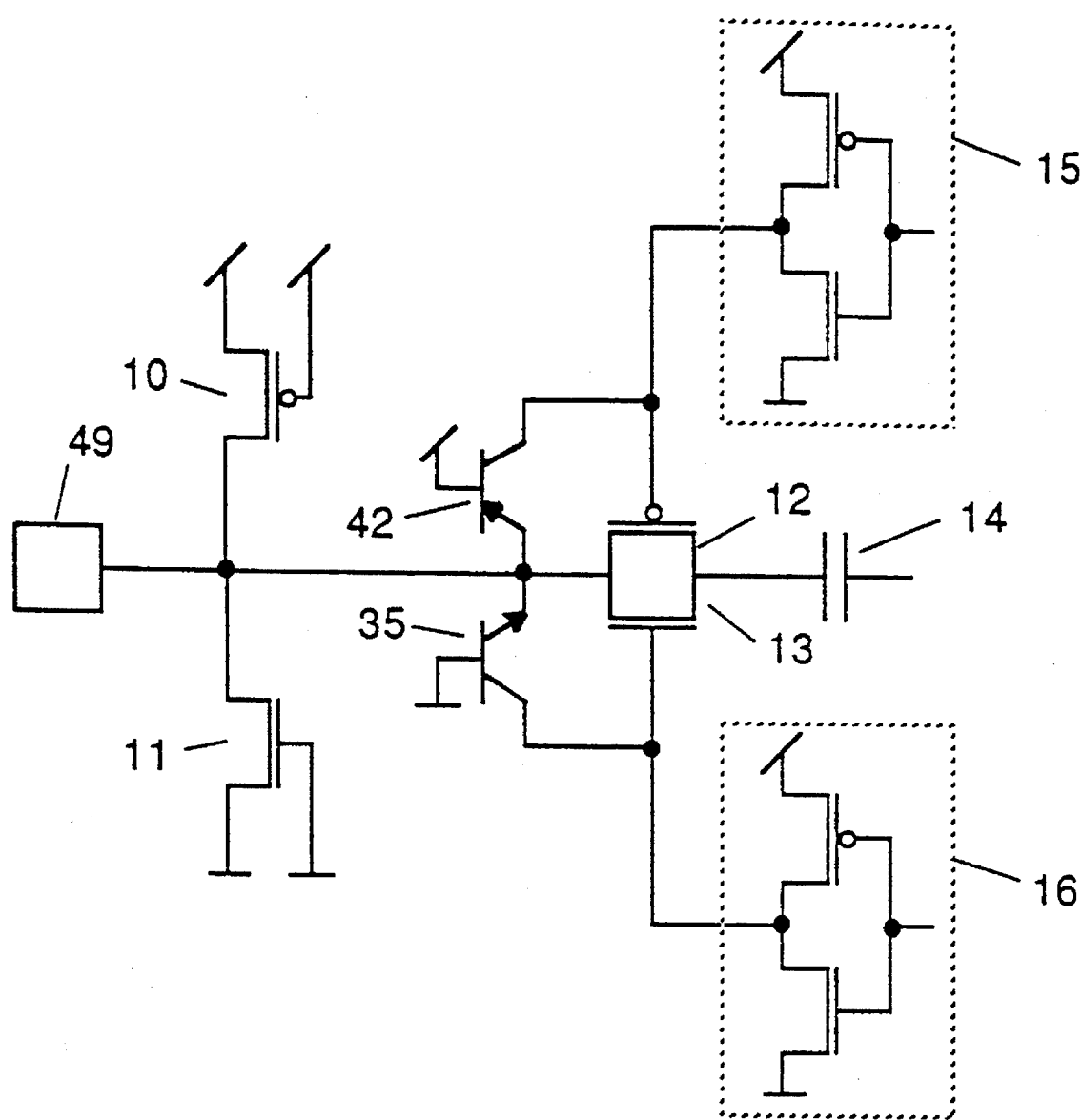
FIG. 16 is a circuit diagram of a semiconductor device of the twelfth example according to the present invention.
Figure 17:
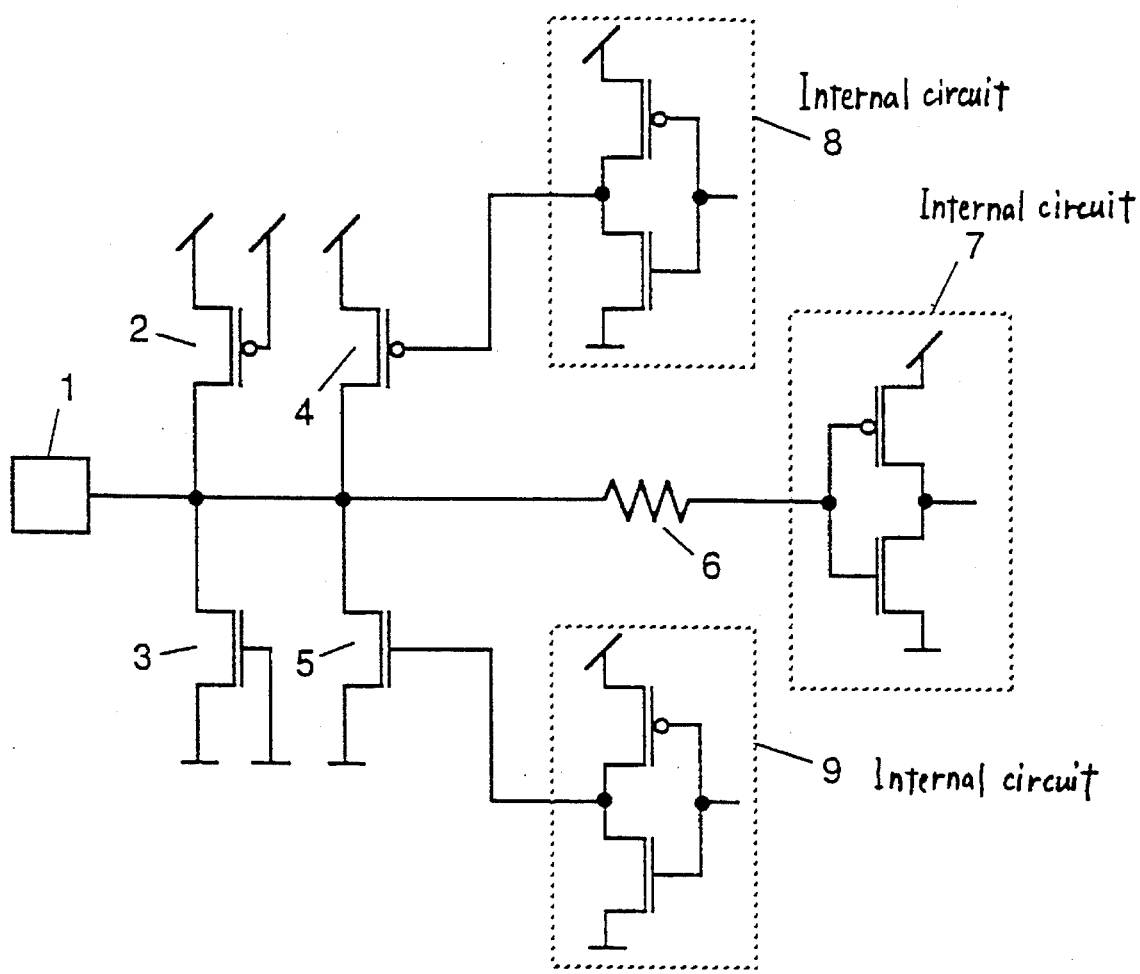
FIG. 17 is a circuit diagram of a conventional semiconductor device.
Figure 18:
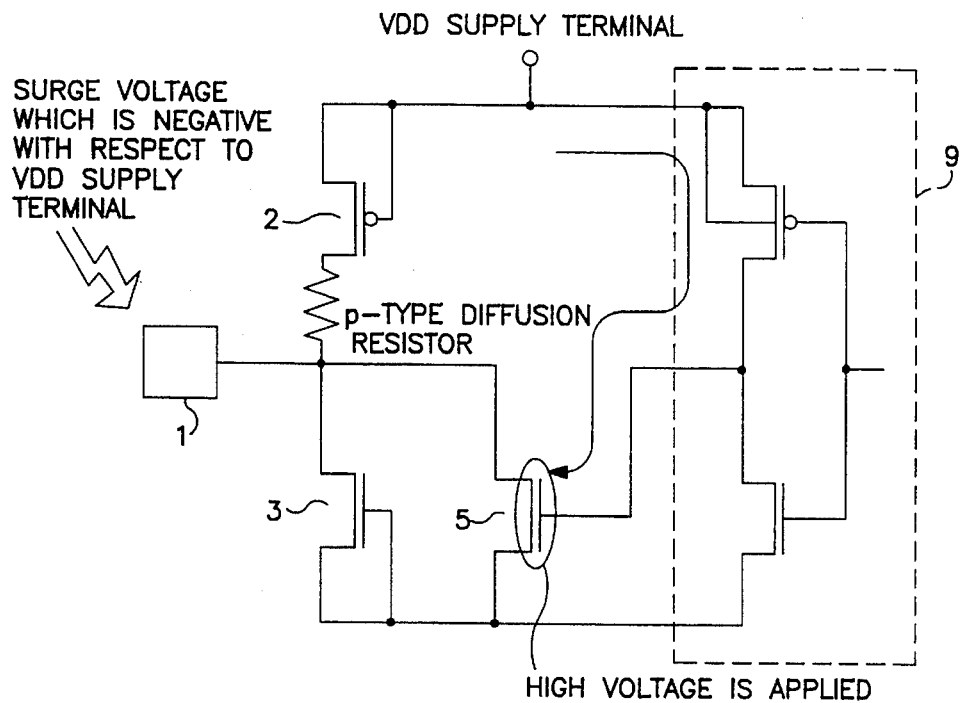
FIG. 18 is a schematic view illustrating a state in which a surge voltage is applied to a conventional semiconductor device.
Figure 20:
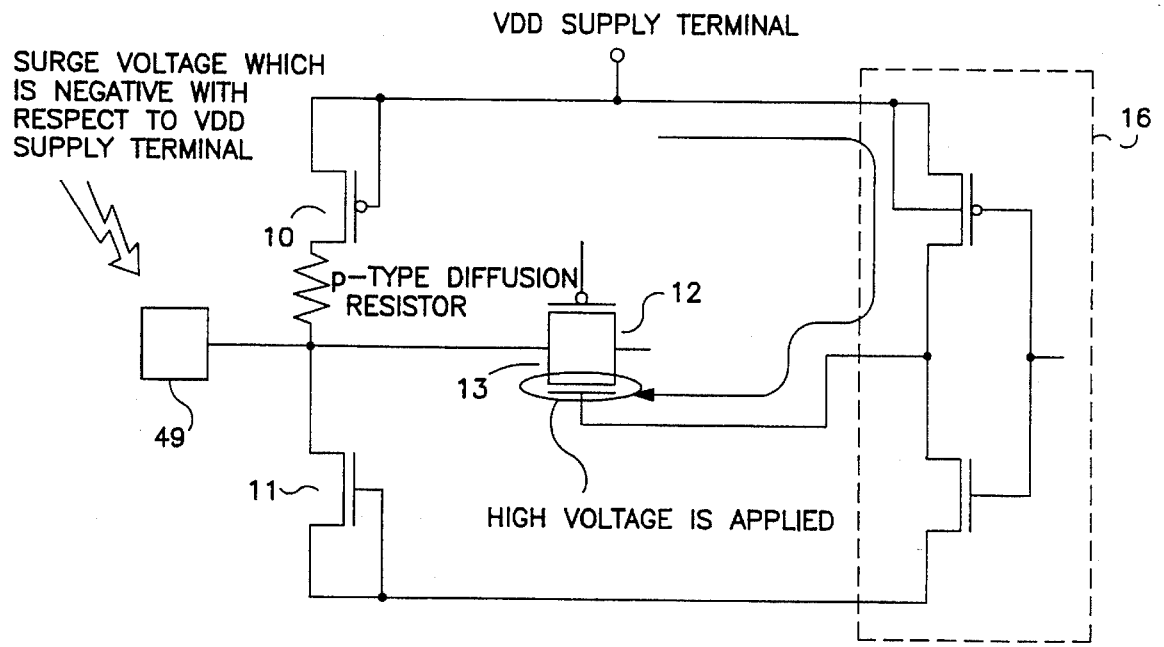
FIG. 20 is a schematic view illustrating a state in which a surge voltage is applied to a conventional semiconductor device.
Figure 19:
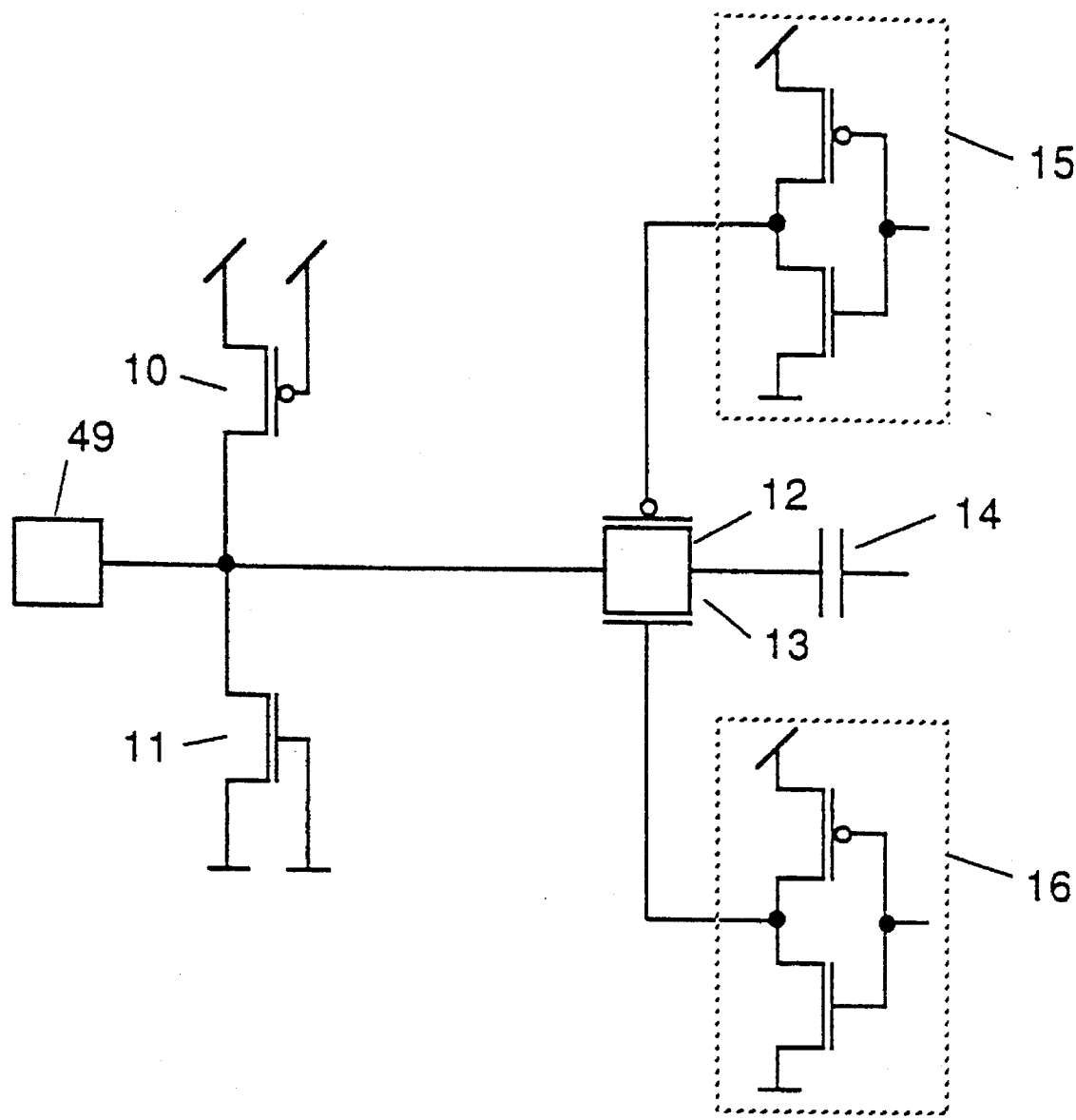
FIG. 19 is a circuit diagram of another conventional semiconductor device.

FIG. 16 is a circuit diagram of a semiconductor device of the twelfth example according to the present invention. In the present example, the npn-bipolar transistor 35 as the first switching element and the pnp-bipolar transistor 42 as the second switching element are formed in the same input/output circuit.

According to the present invention, the n-channel MOS transistor or the npn-bipolar transistor is connected between the drain and the gate of the n-channel output transistor or the n-channel transfer gate transistor. Because of this structure, in a case where a surge voltage which is negative with respect to the $V_{DD}$ supply terminal is applied to the input/output terminal, the n-channel MOS transistor or the npn-bipolar transistor works to reduce a voltage applied to the gate oxide film of the n-channel output transistor or the n-channel transfer gate transistor. Thus, the electrostatic damage to the gate oxide film due to the surge voltage can be prevented. Likewise, the p-channel MOS transistor or the pnp-bipolar transistor is connected between the drain and the gate of the p-channel output transistor or the p-channel transfer gate transistor. Because of this structure, in a case where a surge voltage which is positive with respect to the ground terminal is applied to the input/output terminal, the p-channel MOS transistor or the pnp-bipolar transistor works to reduce a voltage applied to the gate oxide film of the p-channel output transistor or the p-channel transfer gate transistor. Thus, the electrostatic damage to the oxide film due to the surge voltage can be prevented.

EXAMPLE 13

Figure 24:
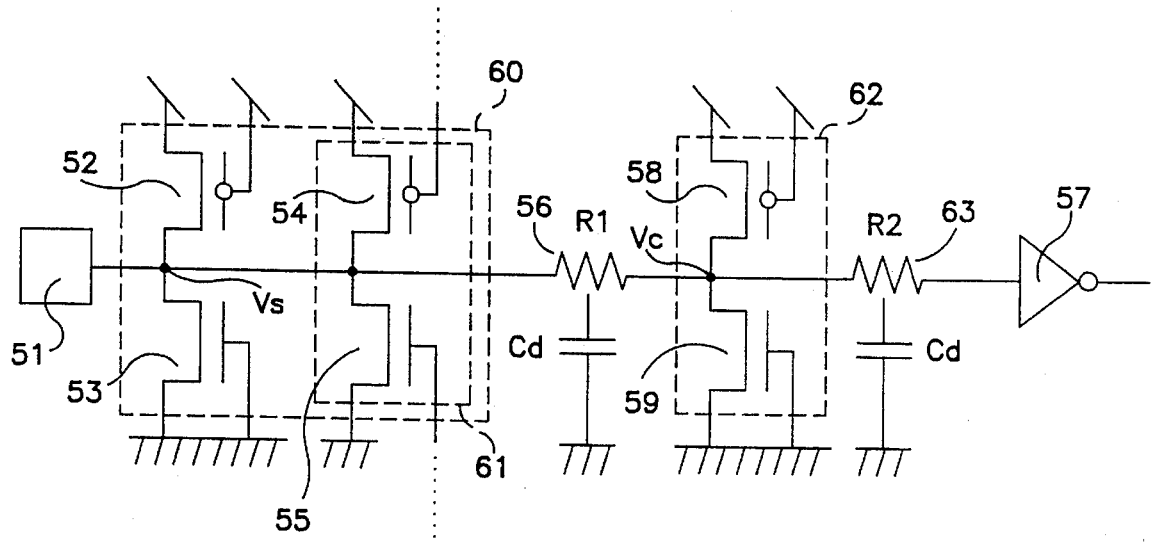
FIG. 24 is a circuit diagram of a semiconductor device of the thirteen example according to the present invention.

FIG. 24 is a circuit diagram of a semiconductor device of the thirteenth example according to the present invention.

In FIG. 24, the input/output terminal 51 is connected to each drain of the p-channel protection transistor 52, n-channel protection transistor 53, p-channel output transistor 54, and n-channel output transistor 55. In more detail, a source and a gate of the p-channel protection transistor 52 are connected to a supply terminal. A source and a gate of the n-channel protection transistor 53 are connected to a ground terminal. A source of the p-channel output transistor 54 and a source of the n-channel output transistor 55 are connected to the supply terminal and the ground terminal, respectively. A gate of each of these output transistors 54 and 55 is connected to an internal circuit (not shown) for regulating the output level on the input/output terminal 51. Here, the p-channel output transistor 54 and the n-channel output transistor 55 constitute an output inverter 61.

The p-channel protection transistor 52, the n-channel protection transistor 53, the p-channel output transistor 54, and the n-channel output transistor 55 are collectively referred to as first protection transistors 60.

In the semiconductor device of the present example, a first protection resistor 56, auxiliary protection transistors 62, and a second protection resistor 63 are connected in series in this order between the first protection transistors 60 and an input gate 57. The auxiliary protection transistors 62 in this example have a CMOS structure which includes a p-channel protection transistor 58 and an n-channel protection transistor 59.

In the semiconductor device, surge charges inputted into the input/output terminal 51 are transferred to the first protection transistors 60. When an electrical potential at the drain of the first protection transistors 60 becomes a high level due to the surge charges, an electrical potential at a semiconductor substrate is also increased together with that of the drain. As a result, a parasitic bipolar operation is started, in which the drain, the substrate, and the source work as a collector, a base, and an emitter, respectively. Under the operation of the parasitic bipolar, the surge charges are rapidly transferred to the ground terminal or the supply terminal.

The first protection transistors 60 and the auxiliary protection transistors 62 are connected to each other via the first protection resistor 56. An electrical potential $V_C$ at a connection node between the first protection resistor 56 and the auxiliary protection transistors 62 is obtained by adding an electrical potential $V_{bi}$ of the n-channel protection transistor 59 during the bipolar operation to a voltage due to a parasitic resistance $R_f$ of the n-channel protection transistor 59.

The voltage due to the parasitic resistance $R_f$ is represented as $R_f(V_s - V_{bi})/(R_1 + R_f)$, wherein $V_s$ and $R_1$ are an electrical potential of the drain of the first protection transistors 60 and a resistance of the first protection resistor 56, respectively.

As a result, the following equation is obtained.

$$V_c = (V_s - V_{bi}) \cdot R_f/(R_1 + R_f) + V_{bi}$$

Moreover, the equation is also represented as follows based on the relationship of $V_s \gg V_{bi}$.

$$V_c = V_s \cdot R_f/(R_1 + R_f) + V_{bi} \tag{1}$$

As is understood from the equation (1), when the resistance R1 of the first protection resistor 56 has a large value, the electrical potential $V_c$ is lowered.

In recent years, the input gate 57 includes MOS transistor having a gate oxide film which is made thin according to a scaling rule, and a breakdown voltage $V_b$ of the gate oxide film may be lower than the electrical potential $V_{bi}$.

As is apparent from the equation (1), $V_c$ is larger than $V_{bi}$. In the present invention, the auxiliary protection transistors 62 and the input gate 57 in the internal circuit are connected to each other via the second protection resistor 63. Accordingly, the electrical potential $V_c$ which has not been enough lowered in the auxiliary protection transistors 62 can be further lowered by the second protection resistor 63, thereby making an electrical potential $V_{in}$ at the input gate 57 less than $V_b$.

Since the second protection resistor 63 is provided between the auxiliary protection transistors 62 and the input gate 57 of the internal circuit, the electrical potential $v_c$ is lowered by the auxiliary protection transistors 62 without making the resistance value $R_1$ so large. As a result, an input/output circuit in which the resistance $R_1$ can be lowered as much as possible and a small load resistance during the input/output operation is obtained.

Figure 25:
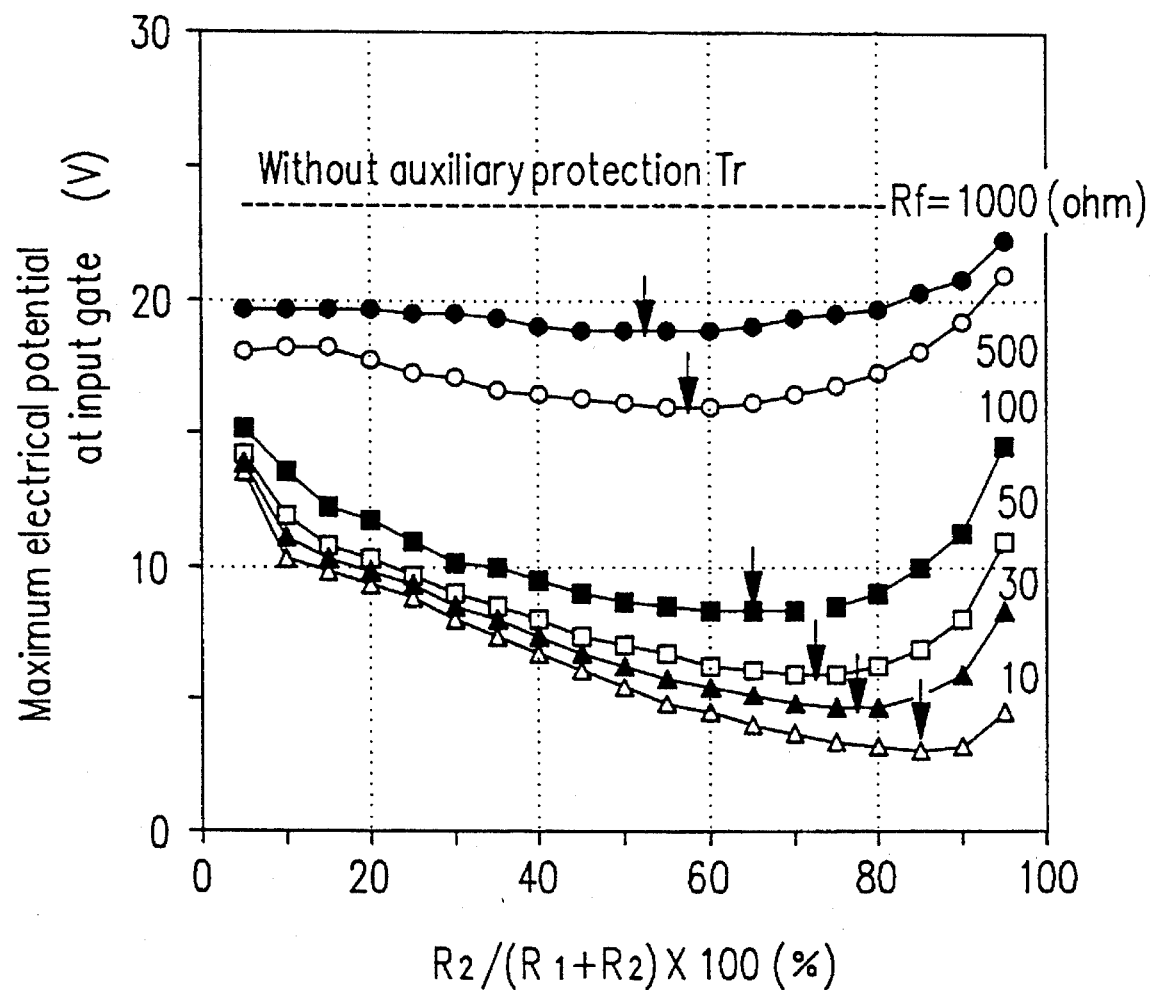
FIG. 25 is a graph showing a dependence of a maximum electrical potential at an input gate upon a ratio of resistance of a second protection resistor $R_2$ to a total resistance of a first and the second protection resistors $(R_1+R_2)$ in a semiconductor device according to the present invention.
Figure 29:
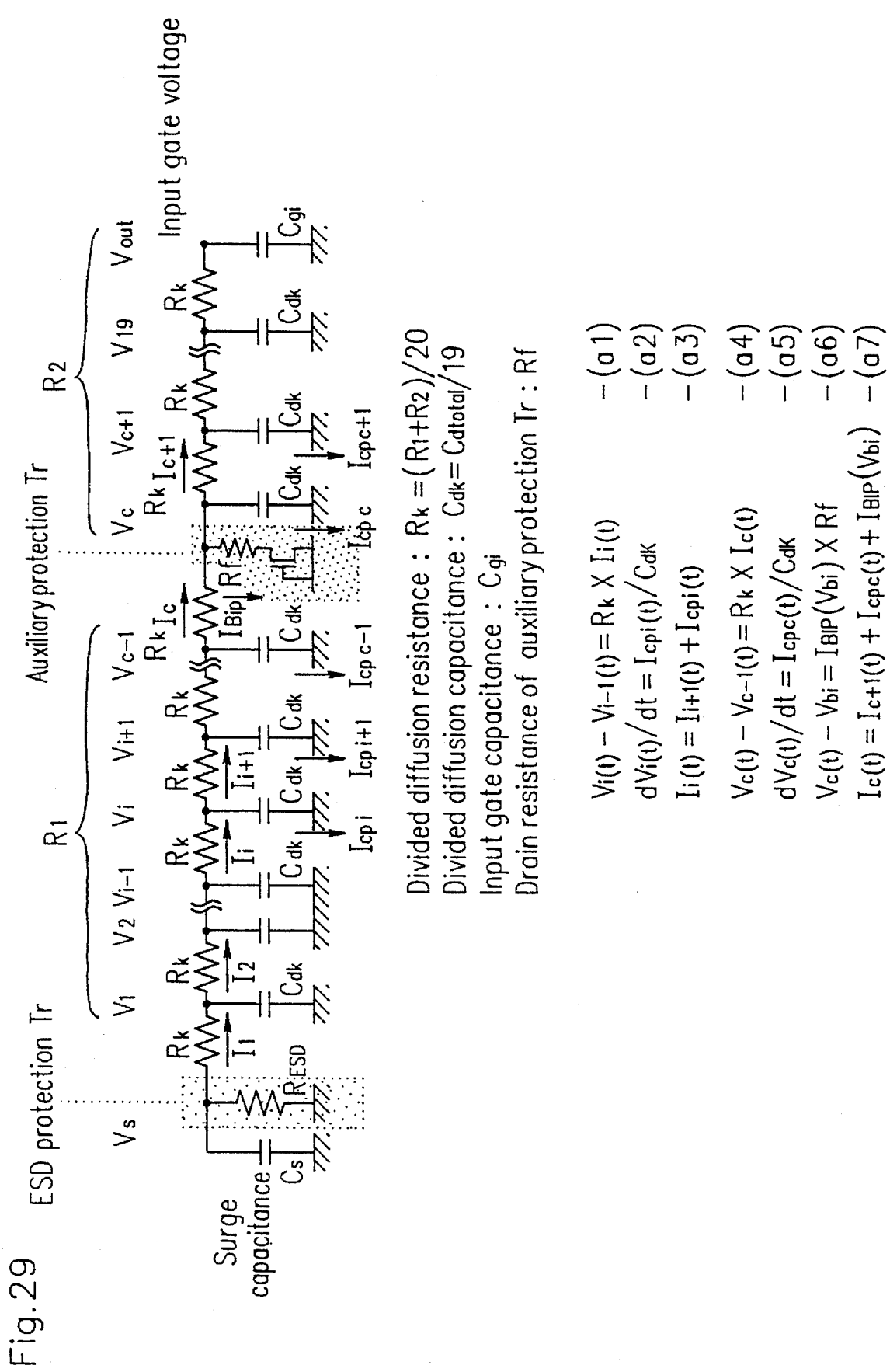
FIG. 29 is a diagram showing an equivalent circuit and its current continuity equation for simulation.
Figure 30:
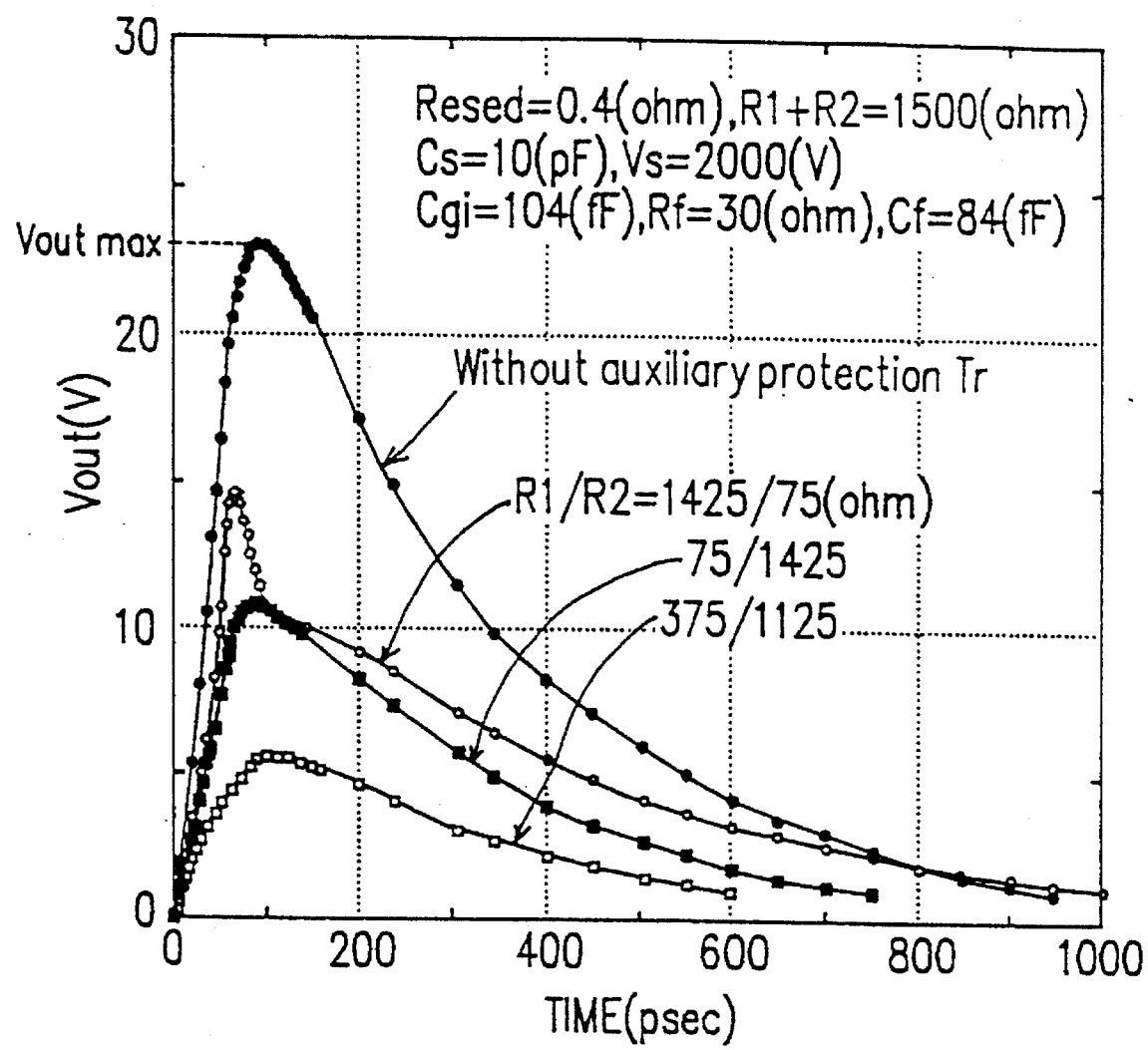
FIG. 30 is a graph showing a time transition of an input gate electrical potential in a semiconductor device according to the present invention.

FIGS. 25 and 30 show simulation (calculation) results of an electrical potential ($V_{out}$) at the input gate 7 of the internal circuit. In a graph of FIG. 25, a horizontal axis and a vertical axis represent the ratio of the resistance $R_2$ of the second protection resistor 63 to the total resistance $(R_1+R_2)$ and a maximum input gate voltage, respectively. A plurality of curves in the graph are obtained by varying the value of the parasitic resistance $R_f$. A graph of FIG. 30 shows a dependence of the input gate voltage ($V_{out}$) upon a time transition. The graphs of FIGS. 25 and 30 are obtained by solving a current continuity equation based on an equivalent circuit shown in FIG. 29. The current continuity equations (a1) through (a7) in FIG. 29 are obtained by dividing the resistance R1 of the first protection resistor 56 and the resistance R2 of the second protection resistor 63 formed from diffusion layers into a plurality of small resistors. A resistance value of each divided resistance is represented as $R_k$ and a parasitic capacitance of each resistor is represented as $C_{dk}$. Further, a current flowing through an i-th resistance is represented as $I_i$.

The graph in FIG. 25 reveals the following:

By making the parasitic resistance $R_f$ smaller, the electrical potential $V_c$ of the equation (1) can be lowered. Further, in the case of $R_f<100$ (ohms), an optimized value of $R_2/(R_1+R_2)$ is represented by the following inequality:

$$\tfrac{1}{2} < R_2/(R_1+R_2) < \tfrac{9}{10}$$

In the case where the protection resistors 56 and 63 satisfy the condition defined by the above inequality, the electrical potential $V_c$ which has not completely been lowered in the first protection transistors 60 can be lowered by the first protection resistor 56 whose value is not so large. In addition, an input gate electrical potential $V_{in}$ can be made less than the breakdown voltage $V_b$ of the gate oxide film by the second protection resistor 63 whose value is relatively large. As is mentioned above, even though the load resistance $(R_1+R_2)$ is constant, the application of the surge voltage effectively prevents the increase of the input gate electrical potential, thereby avoiding a breakdown of the input gate 57. It is preferable that the value of the first protection resistor 56 is set at 10 ohms or more.

In the present example, the first protection transistors 60 and the auxiliary protection transistors 62 are connected to each other via the first protection resistor 56. Accordingly, the input of the surge voltage leads to the parasitic bipolar operation of an electrical potential, which cannot be absorbed in the first protection transistors 60, by the auxiliary protection transistors 62, thereby restraining the increase of the electrical potential $V_c$. Moreover, because of the second protection resistor 63, the electrical potential $V_c$ is sufficiently lowered to less than a gate breakdown voltage and an input/output circuit of a high speed can be obtained without increasing an input impedance, thereby improving a resistance for an electrostatic breakdown of the gate oxide film of the input gate 57.

EXAMPLE 14

Figure 26:
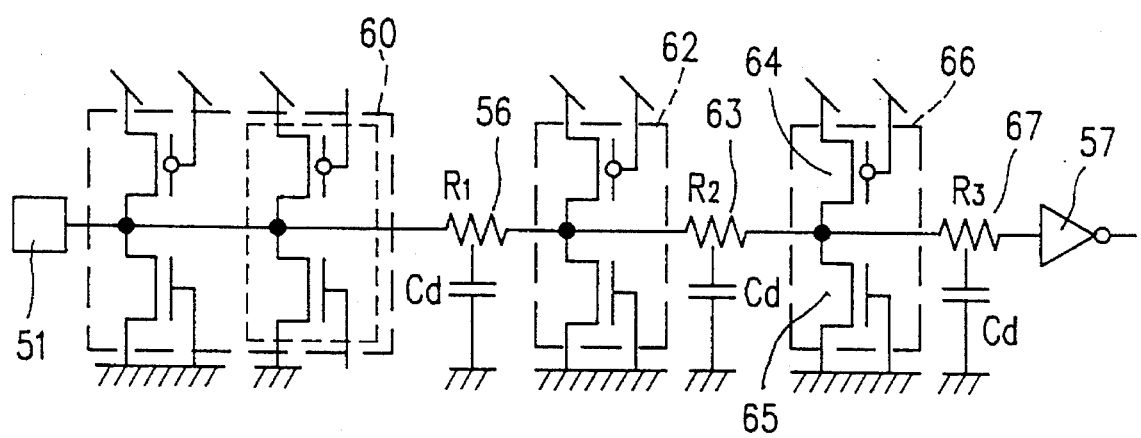
FIG. 26 is a circuit diagram of a semiconductor device of the fourteenth example according to the present invention.
Figure 27:
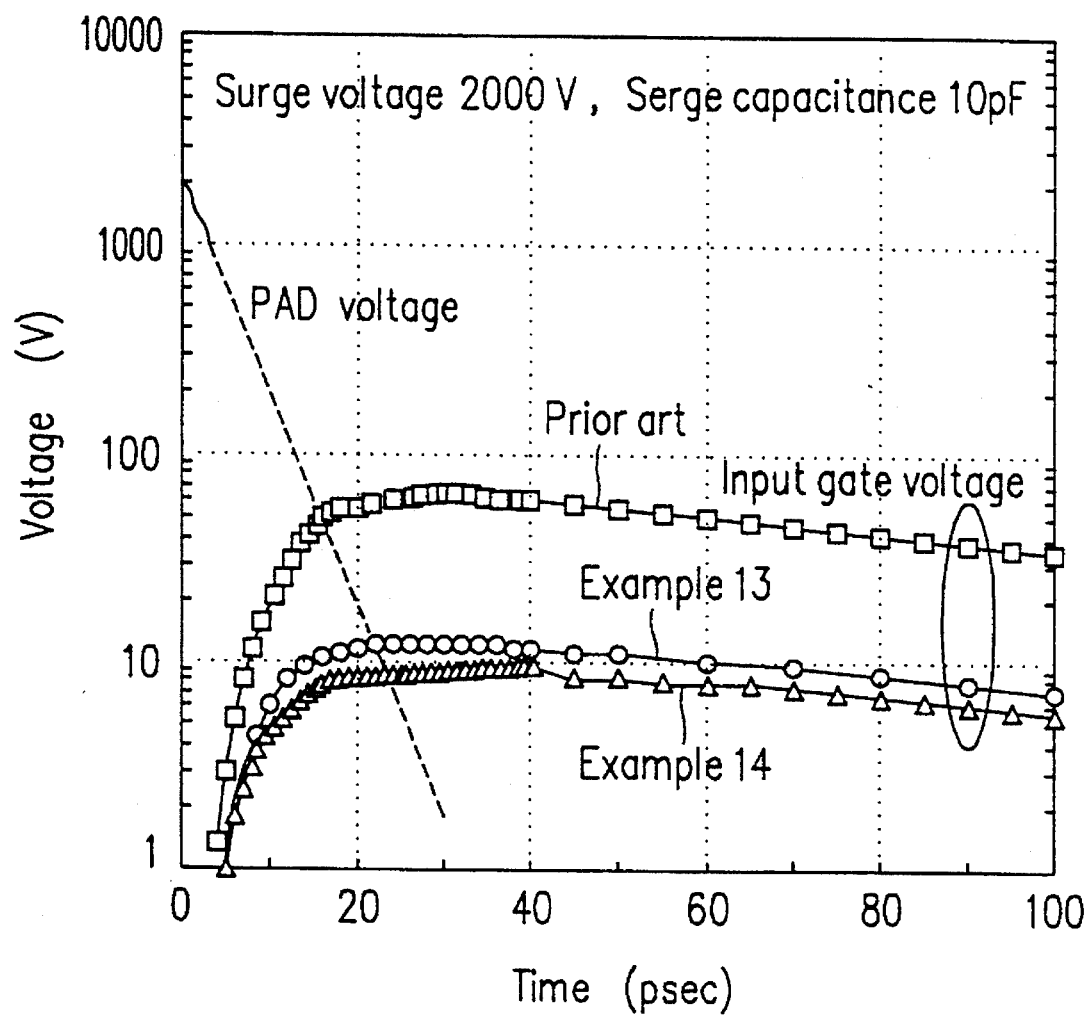
FIG. 27 is a graph showing a time transition of an input electrical potential in a semiconductor device according to the present invention.
Figure 28A:
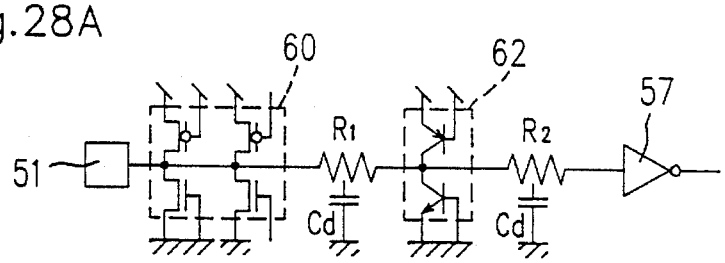
FIGS. 28A through 28F are a circuit diagram for modified examples of the present invention.
Figure 28B:
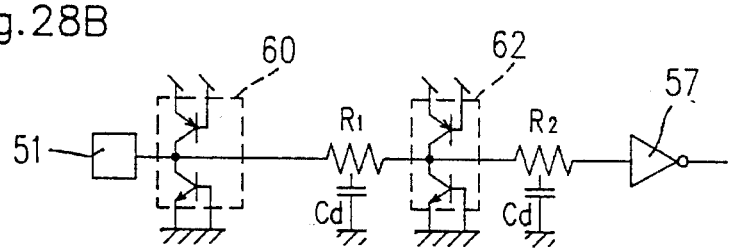
Figure 28C:
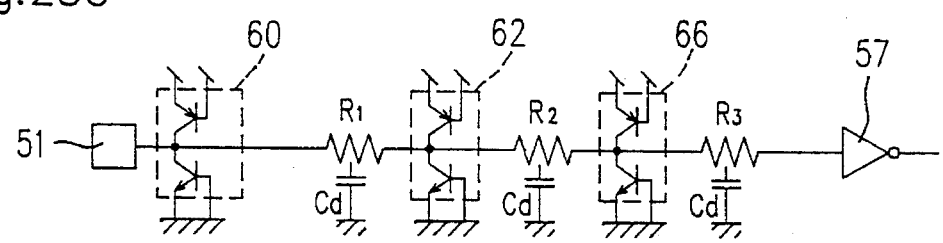
Figure 28D:
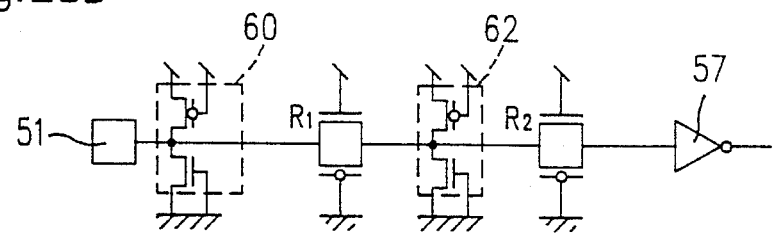
Figure 28E:
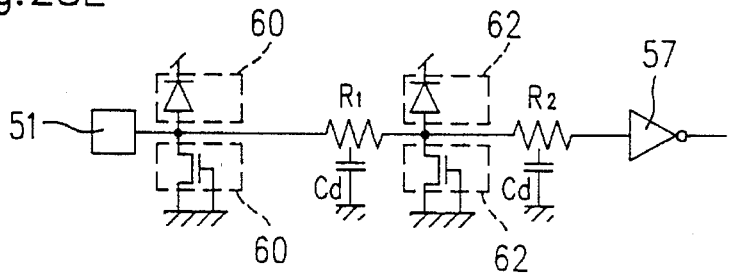
Figure 28F:
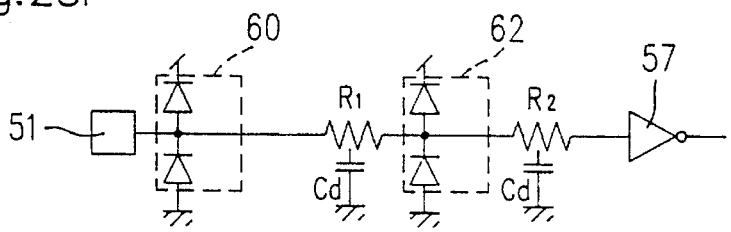

FIG. 26 is a circuit diagram of a semiconductor device of the fourteenth example according to the present invention. The semiconductor device includes another pair of second auxiliary protection transistors 66 and a third protection resistor 67. FIG. 27 is a graph showing a dependence of an input gate electrical potential (voltage) upon a time transition in the case where a surge capacitance of 10 pF and a surge voltage of 2000 volts are applied to an input/output terminal 51. The graph is obtained by simulation with respect to the semiconductor device according to the present invention. In FIG. 27, a result of the simulation with respect to a conventional example is also shown. A total channel width W and resistance (=1500 ohms) of the protection transistors are kept uniform.

As is understood from FIG. 27, an electrical potential at the input gate 57 in each case of one, two, and three pairs of protection transistors (60, 62, 66) and resistors (56, 63, 67) is 61 V, 12 V, and 9 V. Accordingly, the increase of the pair leads to the decrease of the electrical potential at the input gate 57. This is because a surge voltage which cannot be absorbed in one protection transistor can more easily be absorbed in the next protection transistor via the resistors. That is, in three pairs of the protection transistors and the resistors, the surge voltage is more improved compared with one pair and two pairs of the protection transistors and the resistors, thereby effectively avoiding the input gate breakdown.

FIGS. 28A through 28F show examples of circuit structures of semiconductor devices according to the present invention, which are obtained by modifying the semiconductor devices in Examples 13 and 14. The semiconductor device shown in FIGS. 24 and 26 includes CMOS type transistors as the auxiliary protection transistors 62. However, in stead of the CMOS type transistors, bipolar transistors (FIGS. 28A through 28C), an NMOS or PMOS transistor (FIG. 28E), or a PN diode (FIGS. 28E and 28F) may be used as the electronic protection element. Further, as the first and second protection resistors, a diffusion layer formed in the semiconductor substrate, a highly resistive non-doped polycrystalline silicon film, a normally-on type transistor, or transfer gate (FIG. 28D) may be used.

The auxiliary protection transistors with the two protection resistors at the both sides allow the load resistance (input impedance) to be low as compared to the case where a single resistor is employed. Thus, the present invention provides a short delay time input operation and a high electrostatic breakdown voltage for a semiconductor device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising an input/output terminal, a first terminal for providing a first electrical potential, and a second terminal for providing a second electrical potential which is lower than the first electrical potential, wherein the device further comprises:

a first n-channel MOS transistor having a drain connected to the input/output terminal, a source connected to the second terminal, and a gate electrode to be electrically connected to the first terminal; and first switching means for switching between an electrically conductive state and a non-conductive state between the drain and the gate electrode of the first n-channel MOS transistor, the means forming the electrically conductive state between the drain and the gate electrode of the first n-channel MOS transistor, in a case where a surge voltage lower than the first electrical potential is applied to the input/output terminal, and an electrical potential difference between the drain and the gate electrode of the first n-channel MOS transistor exceeds a predetermined voltage lower than a breakdown voltage of the gate oxide of the first n-channel MOS transistor.

2. A semiconductor device according to claim 1, wherein the first switching means is a second n-channel MOS transistor having a source connected to the drain of the first n-channel MOS transistor, a drain connected to the gate electrode of the first n-channel MOS transistor, and a gate connected to the second terminal.

3. A semiconductor device according to claim 2, wherein a circuit element is provided between the gate of the second n-channel MOS transistor and the second terminal.

4. A semiconductor device according to claim 3, wherein the circuit element is a resistor.

5. A semiconductor device according to claim 3, wherein the circuit element is a transistor.

6. A semiconductor device according to claim 1, wherein the first switching means is an npn-bipolar transistor having an emitter connected to the drain of the first n-channel MOS transistor, a collector connected to the gate electrode of the first n-channel MOS transistor, and a base connected to the second terminal.

7. A semiconductor device according to claim 1, further comprising a p-channel MOS transistor having a drain connected to the input/output terminal and a source connected to the first terminal.

8. A semiconductor device comprising an input/output terminal, a first terminal for providing a first electrical potential, and a second terminal for providing a second electrical potential which is lower than the first electrical potential, wherein the device further comprises:

a first p-channel MOS transistor having a drain connected to the input/output terminal, a source connected to the first terminal, and a gate electrode to be electrically connected to the second terminal; and switching means for switching between an electrically conductive state and a non-conductive state between the drain and the gate electrode of the first p-channel MOS transistor, the means forming the electrically conductive state between the drain and the gate electrode of the first p-channel MOS transistor, in a case where a surge voltage higher than the second electrical potential is applied to the input/output terminal, and an electrical potential difference between the drain and the gate electrode of the first p-channel MOS transistor exceeds a predetermined voltage lower than a breakdown voltage of the gate oxide of the first p-channel MOS transistor.

9. A semiconductor device according to claim 8, wherein the switching means is a second p-channel MOS transistor having a source connected to the drain of the first p-channel MOS transistor, a drain connected to the gate electrode of the first p-channel MOS transistor, and a gate connected to the first terminal.

10. A semiconductor device according to claim 9, wherein a circuit element is provided between the gate of the second p-channel MOS transistor and the first terminal.

11. A semiconductor device according to claim 10, wherein the circuit element is a resistor.

12. A semiconductor device according to claim 10, wherein the circuit element is a transistor.

13. A semiconductor device according to claim 8, wherein the switching means is a pnp-bipolar transistor having an emitter connected to the drain of the first p-channel MOS transistor, a collector connected to the gate electrode of the first p-channel MOS transistor, and a base connected to the first terminal.

14. A semiconductor device according to claim 8, further comprising a first n-channel MOS transistor having a drain connected to the input/output terminal and a source connected to the second terminal.

15. A semiconductor device comprising an input/output terminal, a first terminal for providing a first electrical potential, and a second terminal for providing a second electrical potential which is lower than the first electrical potential, wherein the device further comprises:

a first n-channel MOS transistor having a drain connected to the input/output terminal, a source connected to an internal circuit, and a gate electrode to be electrically connected to the first terminal; and first switching means for switching between an electrically conductive state and a non-conductive state between the drain and the gate electrode of the first n-channel MOS transistor, the means forming the electrically conductive state between the drain and the gate electrode of the first n-channel MOS transistor, in a case where a surge voltage lower than the first electrical potential is applied to the input/output terminal, and an electrical potential difference between the drain and the gate electrode of the first n-channel MOS transistor exceeds a predetermined voltage lower than a breakdown voltage of the gate oxide of the first n-channel MOS transistor.

16. A semiconductor device according to claim 15, wherein the first switching means is a second n-channel MOS transistor having a source connected to the drain of the first n-channel MOS transistor, a drain connected to the gate electrode of the first n-channel MOS transistor, and a gate connected to the second terminal.

17. A semiconductor device according to claim 16, herein a circuit element is provided between the gate of the second n-channel MOS transistor and the second terminal.

18. A semiconductor device according to claim 17, wherein the circuit element is a resistor.

19. A semiconductor device according to claim 17, wherein the circuit element is a transistor.

20. A semiconductor device according to claim 15, wherein the first switching means is an npn-bipolar transistor having an emitter connected to the drain of the first n-channel MOS transistor, a collector connected to the gate electrode of the first n-channel MOS transistor, and a base connected to the second terminal.

21. A semiconductor device according to claim 15, further comprising a p-channel MOS transistor having a drain connected to the input/output terminal and a source connected to the internal circuit.

22. A semiconductor device comprising an input/output terminal, a first terminal for providing a first electrical potential, and a second terminal for providing a second electrical potential which is lower than the first electrical potential, wherein the device further comprises:

a first p-channel MOS transistor having a drain connected to the input/output terminal, a source connected to an internal circuit, and a gate electrode to be electrically connected to the first terminal; and switching means for switching between an electrically conductive state and a non-conductive state between the drain and the gate electrode of the first p-channel MOS transistor, the means forming the electrically conductive state between the drain and the gate electrode of the first p-channel MOS transistor, in a case where a surge voltage higher than the second electrical potential is applied to the input/output terminal, and an electrical potential difference between the drain and the gate electrode of the first p-channel MOS transistor exceeds a predetermined voltage lower than a breakdown voltage of the gate oxide of the first p-channel MOS transistor.

23. A semiconductor device according to claim 22, wherein the switching means is a second p-channel MOS transistor having a source connected to the drain of the first p-channel MOS transistor, a drain connected to the gate electrode of the first p-channel MOS transistor, and a gate connected to the first terminal.

24. A semiconductor device according to claim 23, wherein a circuit element is provided between the gate electrode of the second p-channel MOS transistor and the first terminal.

25. A semiconductor device according to claim 24, wherein the circuit element is a resistor.

26. A semiconductor device according to claim 24, wherein the circuit element is a transistor.

27. A semiconductor device according to claim 22, wherein the second switching means is a pnp-bipolar transistor having an emitter connected to the drain of the first p-channel MOS transistor, a collector connected to the gate electrode of the first p-channel MOS transistor, and a base connected to the first terminal.

28. A semiconductor device according to claim 22, further comprising a first n-channel MOS transistor having a drain connected to the input/output terminal and a source connected to the internal circuit.

29. A semiconductor device comprising an input/output terminal, an internal circuit connected to the input/output terminal, a first terminal for providing a first electrical potential, and a second terminal for providing a second electrical potential which is lower than the first electrical potential, wherein the device further comprises:

first protection means connected between the input/output terminal and the internal circuit, the first protection means guiding surge charges applied to the input/output terminal to the first terminal or the second terminal, thereby lowering an electrical potential due to the surge charges; and auxiliary protection means connected between the first protection means and the internal circuit, and further lowering the electrical potential due to the surge charges, the auxiliary protection means including a first electronic element connected to at least one of the first terminal and the second terminal, a first protection resistor provided between the first electronic element and the first protection means, and a second protection resistor provided between the first electronic element and the internal circuit, wherein a resistance of the second protection resistor is in a range between half of a total resistance of the first protection resistor and the second protection resistor, and nine-tenths of the total resistance of the first protection resistor and the second protection resistor.

30. A semiconductor device according to claim 29, wherein the electronic element includes an MOS transistor.

31. A semiconductor device according to claim 29, wherein the electronic element includes a bipolar transistor.

32. A semiconductor device according to claim 29, wherein the first electronic element includes a p-channel MOS transistor having a drain connected to the first protection resistor, a source and a gate connected to the first terminal; and an n-channel MOS transistor having a drain connected to the first protection resistor, a source and a gate connected to the second terminal.

33. A semiconductor device according to claim 29, wherein the auxiliary protection means further includes between the second protection resistor and the internal circuit, a second electronic element connected to at least one of the first terminal and the second terminal; and a third protection resistor provided between the second electronic element and the internal circuit.

34. A semiconductor device according to claim 29, wherein a resistance of the first protection resistor is 10 ohms or more.

35. A semiconductor device according to claim 29, wherein the first protection means includes a p-channel MOS transistor having a drain connected to the input/output terminal, and a source and a gate connected to the first terminal; and an n-channel MOS transistor having a drain connected to the input/output terminal, and a source and a gate connected to the second terminal.

* * * * *

UNITED STATES PATENT AND TRADE MARK OFFICE
CERTIFICATE OF CORRECTION

PATENT NO. : 5,514,893
DATED : May 7, 1996
INVENTOR(S) : Miyanaga et al.

It is certified that error appears in the above-identified patent and that said Letters Patent is hereby corrected as shown below:

Column 18, line 32, "herein" should be --wherein--.

Signed and Sealed this

Second Day of June, 1998

Attest:

Attesting Officer

BRUCE LEHMAN

Commissioner of Patents and Trademarks